US012677541B2

(12) United States Patent
Park et al.

(10) Patent No.: US 12,677,541 B2
(45) Date of Patent: Jul. 7, 2026

(54) DISPLAY PANEL AND METHOD OF MANUFACTURING THE SAME

(71) Applicant: Samsung Display Co., Ltd., Yongin-si (KR)

(72) Inventors: Joonyong Park, Yongin-si (KR); Hyuneok Shin, Yongin-si (KR); Juhyun Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 306 days.

(21) Appl. No.: 18/454,908

(22) Filed: Aug. 24, 2023

(65) Prior Publication Data

US 2024/0172483 A1     May 23, 2024

(30) Foreign Application Priority Data

Nov. 23, 2022    (KR) ........................ 10-2022-0158775

(51) Int. Cl.
| | |
|---|---|
| *H10K 59/122* | (2023.01) |
| *H10K 59/131* | (2023.01) |
| *H10K 59/88* | (2023.01) |
| *H10K 71/20* | (2023.01) |
| *H10K 102/00* | (2023.01) |

(52) U.S. Cl.
CPC ......... *H10K 59/122* (2023.02); *H10K 59/131* (2023.02); *H10K 59/88* (2023.02); *H10K 71/231* (2023.02); *H10K 2102/351* (2023.02)

(58) Field of Classification Search
CPC ........................ H10K 59/122; H10K 59/1201
See application file for complete search history.

(56) References Cited

U.S. PATENT DOCUMENTS

| | | | |
|---|---|---|---|
| 10,510,900 | B2 | 12/2019 | Shin et al. |
| 11,016,325 | B2 | 5/2021 | Kwon et al. |
| 11,158,693 | B2 | 10/2021 | Chung et al. |
| 11,342,404 | B2 | 5/2022 | Ko et al. |
| 11,348,983 | B1 * | 5/2022 | Choung ........... H10K 59/80522 |
| 2007/0138943 | A1 * | 6/2007 | Tano .................... H10K 59/122 |
| | | | 313/503 |

(Continued)

FOREIGN PATENT DOCUMENTS

| | | |
|---|---|---|
| JP | 6072888 | 2/2017 |
| KR | 10-2018-0028084 | 3/2018 |

(Continued)

*Primary Examiner* — Mariceli Santiago
(74) *Attorney, Agent, or Firm* — Harness, Dickey & Pierce, P.L.C.

(57) ABSTRACT

A display panel includes a base layer, a pixel definition layer disposed on the base layer and including a first light emitting opening passing through the pixel definition layer, a bank disposed on the pixel definition layer and including a first bank opening passing through the bank and overlapping the first light emitting opening, and a first light emitting element disposed in the first bank opening and including a first anode including at least a portion exposed through the first light emitting opening, a first cathode that is in contact with the bank, and a first light emitting pattern layer disposed between the first anode and the first cathode. The bank includes a first layer including an AlNiLa alloy and a second layer disposed on the first layer and including a MoTa alloy oxide.

21 Claims, 16 Drawing Sheets

(56)     References Cited

U.S. PATENT DOCUMENTS

2021/0376283  A1      12/2021  Shin et al.
2024/0138194  A1*      4/2024  Park .................. H10K 59/1201
2024/0365645  A1*    10/2024  Park .................... H10K 59/122

FOREIGN PATENT DOCUMENTS

KR      10-2019-0111177        10/2019
KR      10-2020-0039067         4/2020
KR      10-2021-0022206         3/2021
KR      10-2021-0145907        12/2021

* cited by examiner

DISPLAY PANEL AND METHOD OF MANUFACTURING THE SAME

CROSS REFERENCE TO RELATED APPLICATION(S)

This application claims priority to and benefits of Korean Patent Application No. 10-2022-0158775 under 35 U.S.C. § 119, filed on Nov. 23, 2022, the entire contents of which are incorporated herein by reference.

BACKGROUND

1. Technical Field

Embodiments relate to a display panel and a method of manufacturing the display panel.

2. Description of the Related Art

A display device is activated in response to electrical signals. The display device includes a display panel displaying an image. Among the various types of display panels, an organic light emitting display panel has low power consumption, high brightness, and high response speed.

The organic light emitting display panel includes an anode, a cathode, and a light emitting layer. The light emitting layer is divided in each of light-emitting regions and the cathode provides a common voltage in the light-emitting regions.

SUMMARY

Embodiments provide a display panel with increased display efficiency, improved electrical reliability, and improved visibility in case that a light emitting element of the display panel is formed without using a metal mask.

Embodiments provide provides a method of manufacturing the display panel.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display panel may include a base layer, a pixel definition layer disposed on the base layer and including a first light emitting opening passing through the first definition layer, a bank disposed on the pixel definition layer and including a first bank opening passing through the bank and overlapping the first light emitting opening, and a first light emitting element disposed in the first bank opening and including a first anode including at least a portion is exposed through the first light emitting opening, a first cathode that is in contact with the bank, and a first light emitting pattern layer disposed between the first anode and the first cathode. The bank may include a first layer including an AlNiLa alloy and a second layer disposed on the first layer and including a MoTa alloy oxide.

The first layer may include an $Al_xNi$ phase.

The first cathode may be in contact with the $Al_xNi$ phase.

The AlNiLa alloy of the first layer may be an aluminum-based alloy doped with nickel (Ni) and lanthanum (La), a content of the nickel (Ni) may be equal to or greater than about 0.5 at % and equal to or smaller than about 3.0 at %, and a content of lanthanum (La) may be equal to or greater than about 0.1 at % and equal to or smaller than about 0.5 at %.

The second layer may have a reflectance equal to or smaller than about 30%.

The MoTa alloy oxide of the second layer may be a molybdenum-based alloy oxide doped with tantalum (Ta), and a content of tantalum (Ta) may be equal to or greater than about 1.0 at % and equal to or smaller than about 15.0 at %.

The first layer may have a thickness equal to or greater than about 6,000 angstroms and equal to or smaller than about 100,000 angstroms, and the second layer may have a thickness equal to or greater than about 400 angstroms and equal to or smaller than about 800 angstroms.

The display panel may further include a driving voltage line providing a bias voltage, and at least a portion of the driving voltage line may be covered by the first layer.

The driving voltage line and the first anode may have a same structure.

The first layer may include a first inner side surface that defines a first area of the first bank opening, the second layer may include a second inner side surface that defines a second area of the first bank opening, the first inner side surface of the first layer may be disposed inwardly of the second inner side surface of the second layer, and the first cathode may be in contact with the first inner side surface of the first layer.

The display panel may further include a second light emitting element including a second anode, a second cathode that is in contact with the bank, and a second light emitting pattern disposed between the second anode and the second cathode. The pixel definition layer may include a second light emitting opening passing through the pixel definition layer to expose at least a portion of the second anode, the bank may include a second bank opening passing through the bank and overlapping the second light emitting opening, and the second light emitting element may be disposed in the second bank opening.

The display panel may further include a first dummy pattern layer disposed on the bank and spaced apart from the first light emitting pattern layer, the first dummy pattern layer and the the first light emitting pattern layer including a same material, a second dummy pattern layer disposed on the first dummy pattern layer and spaced apart from the first cathode, the second dummy pattern layer and the first cathode including a same material, and a lower encapsulation inorganic pattern layer overlapping the first light emitting opening and disposed on the first light emitting element, the first dummy pattern layer, and the second dummy pattern layer.

In an embodiment, a method of manufacturing a display panel. The manufacturing method of the display panel may include providing a preliminary display panel including a base layer, an anode disposed on the base layer, and a preliminary pixel definition layer disposed on the base layer and covering the anode, forming a first layer including an AlNiLa alloy on the preliminary pixel definition layer, forming a second layer including a MoTa alloy oxide on the first layer, patterning the first layer and the second layer to form a bank including a bank opening, forming a light emitting pattern layer in the bank opening, and forming a cathode in the bank opening to be in contact with the bank.

The forming of the first layer may be performed by a deposition process at a temperature equal to or greater than about 200 degrees Celsius and equal to or smaller than about 250 degrees Celsius.

The forming of the second layer may be performed by a deposition process at a temperature equal to or greater than about 200 degrees Celsius and equal to or smaller than about 250 degrees Celsius.

An Al$_x$Ni phase may be formed on the first layer during the forming of the first layer or the forming of the second layer.

The patterning of the first layer and the second layer may include dry etching the first layer and the second layer to form a preliminary bank opening passing through the first layer and the second layer and wet etching the first layer and the second layer to form the bank opening from the preliminary bank opening. The first layer may include a first inner side surface that defines a first area of the bank opening, the second layer may include a second inner side surface that defines a second area of the bank opening, and the first inner side surface may be disposed inwardly of the second inner side surface in the wet etching of the first layer and a second layer.

The method may further include dry etching the preliminary pixel definition layer to form a pixel definition layer including a light emitting opening overlapping the bank opening may be formed after the patterning of the first layer and a second layer and before the forming of the light emitting pattern layer.

The method may further include wet etching a sacrificial pattern layer of the preliminary display panel, the sacrificial pattern layer disposed on the anode and covered by the preliminary pixel definition layer in the providing of the preliminary display panel, and the wet etching of the sacrificial pattern layer may be performed to form a sacrificial opening overlapping the light emitting opening passing through the sacrificial pattern layer after the dry etching of the preliminary pixel definition layer and before the forming of the light emitting pattern layer.

A first dummy pattern layer may be spaced apart from the light emitting pattern layer, may be disposed on the bank, and may be formed in the forming of the light emitting pattern layer, the first dummy pattern layer and the light emitting pattern layer may include a same material, and a second dummy pattern layer may be spaced apart from the cathode, may be disposed on the bank, and may be formed in the forming of the cathode, and the second dummy pattern layer and the cathode may include a same material.

According to the above, a light emitting layer may be patterned without using a metal mask, and thus, the display panel with improved process reliability and high resolution may be provided.

According to the above, a contact resistance between an electrode of the light emitting element and the bank may be reduced, galvanic corrosion between the bank and a power line may be prevented or minimized, and thus, the display panel with improved display efficiency and electrical reliability may be provided.

According to the above, the reflectance of the bank may be reduced, and thus, the visibility of the display panel may be improved.

According to the above, the display panel with increased display efficiency, improved electrical reliability, and enhanced visibility may be provided.

BRIEF DESCRIPTION OF THE DRAWINGS

The above and other advantages of the disclosure will become readily apparent by reference to the following detailed description when considered in conjunction with the accompanying drawings wherein:

FIG. 6 is a schematic cross-sectional view of a display panel taken along line II-II' of FIG. 4 according to an embodiment;

FIG. 8 is a schematic cross-sectional view of a display panel taken along line III-III' of FIG. 3A according to an embodiment.

DETAILED DESCRIPTION OF THE EMBODIMENTS

Figure 1A:
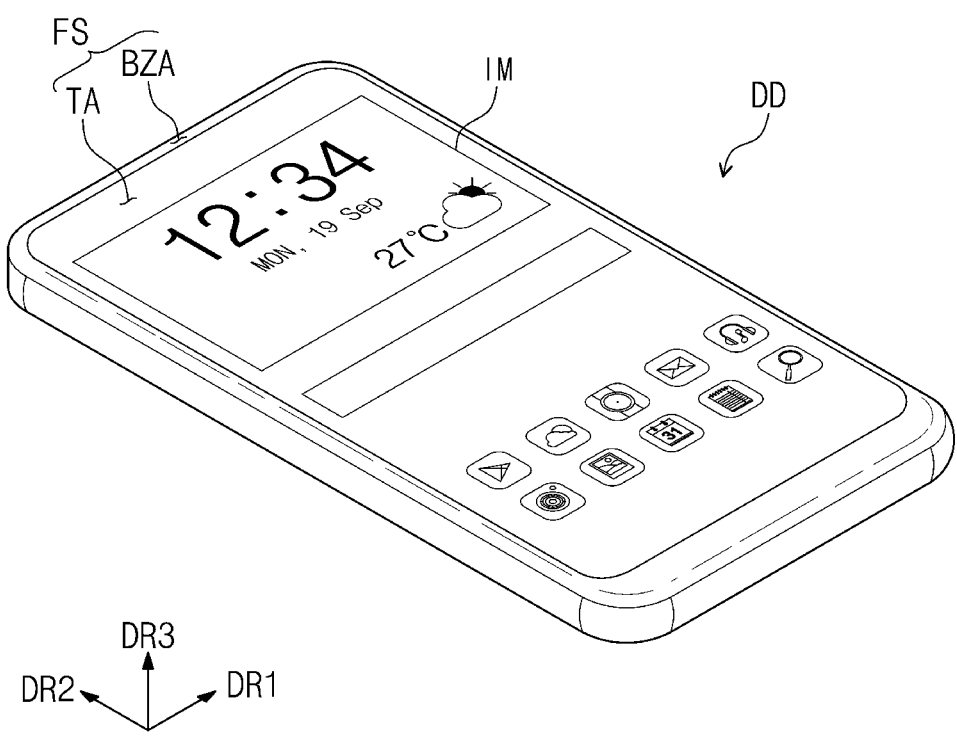
FIG. 1A is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to accompanying drawings.

Figure 1B:
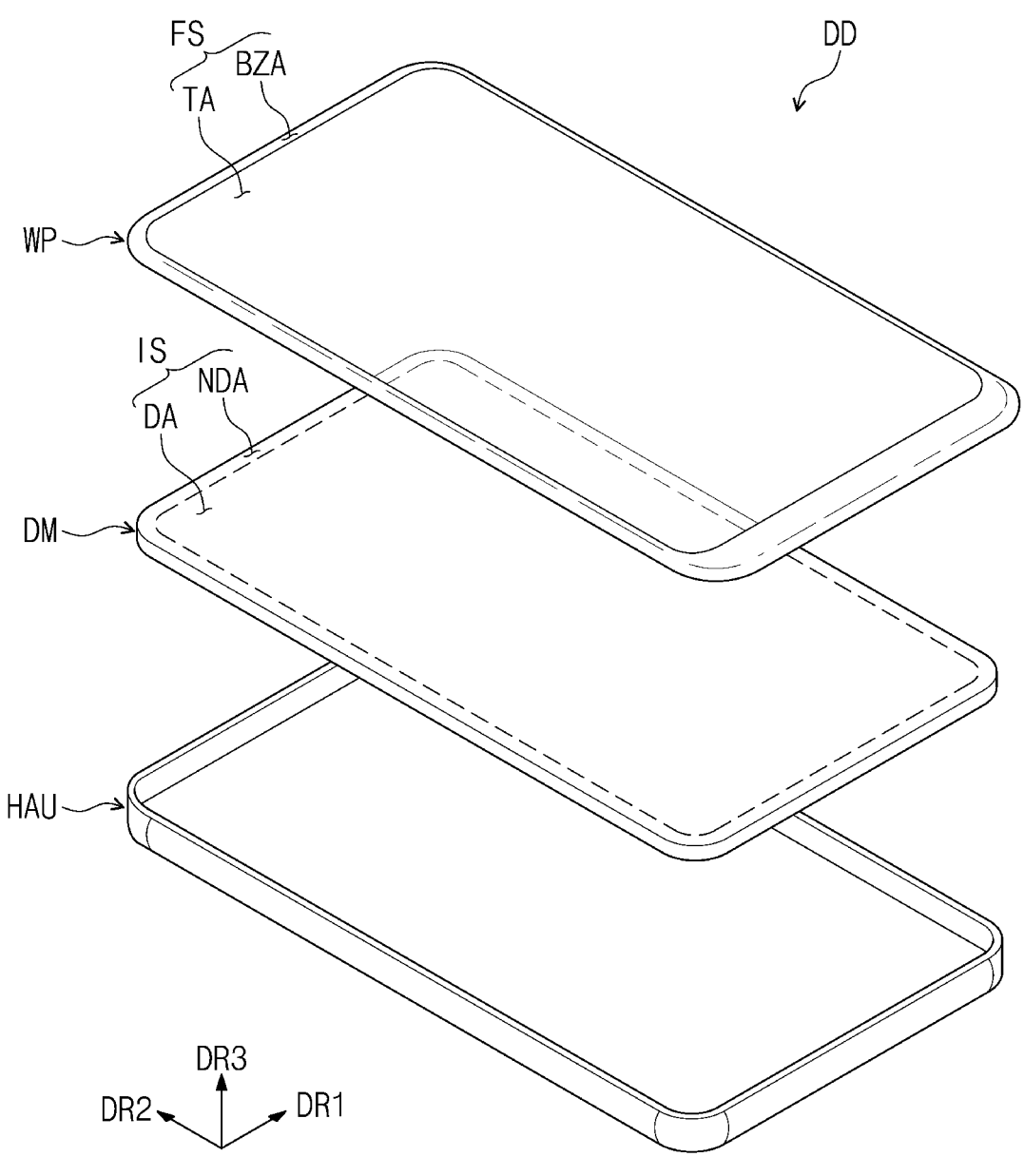
FIG. 1B is an exploded schematic perspective view of a display device according to an embodiment.
Figure 2:
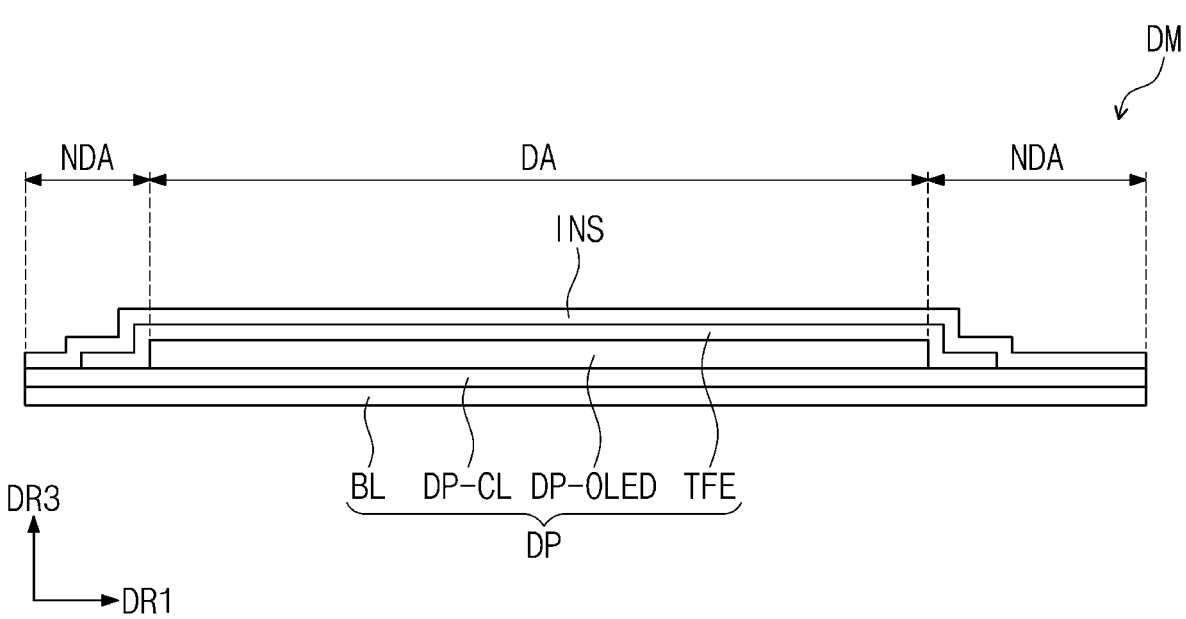
FIG. 2 is a schematic cross-sectional view of a display module according to an embodiment.

FIG. 1A is a schematic perspective view of a display device DD according to an embodiment. FIG. 1B is an exploded schematic perspective view of the display device DD according to an embodiment. FIG. 2 is a schematic cross-sectional view of a display module DM according to an embodiment.

The display device DD may be applied to a large-sized electronic item, such as a television set, a monitor, or an outdoor billboard. For example, the display device DD may be applied to a small-sized electronic device, and a medium-sized electronic device, such as a personal computer, a notebook computer, a personal digital assistant (PDA), a car navigation device, a game device, a smartphone, a tablet computer, and a camera. However, these are examples, and the display device DD may be implemented in other display devices as long as they do not deviate from the disclosure. In an embodiment, the smartphone will be described as a representative example of the display device DD.

Referring to FIGS. 1A, 1B, and 2, the display device DD may display an image IM through a display surface FS, which is substantially parallel to each of a first direction DR1 and a second direction DR2, toward a third direction DR3. The image IM may include a video and a still image. FIG. 1A shows a clock widget and application icons as representative examples of the image IM. The display surface FS through which the image IM is displayed may correspond to a front surface of the display device DD.

In an embodiment, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. Directions indicated by the first, second, and third directions DR1. DR2, and DR3 may be relative to each other, and thus, the directions indicated by the first, second, and third directions DR1, DR2, and DR3 may be changed to other directions. In the following descriptions, the expression "when viewed in a plane" or "in a plan view" means a state of being viewed in the third direction DR3.

Referring to FIG. 1B, the display device DD may include a window WP, a display module DM, and a housing HAU. In an embodiment, the window WP and the housing HAU may be coupled to each other to form an exterior of the display device DD.

The window WP may include an optically transparent insulating material. For example, the window WP may include a glass or plastic material. A front surface of the window WP may define the display surface FS of the display device DD. The display surface FS may include a transmissive area (or light-transmissive area) TA and a bezel area BZA. The transmissive area TA may be an optically transparent area. For example, the transmissive area TA may be an area having a visible light transmittance of about 90% or more.

The bezel area BZA may be an area having a relatively lower transmittance than that of the transmissive area TA. The bezel area BZA may define a shape of the transmissive area TA. The bezel area BZA may be disposed adjacent to the transmissive area TA and may surround the transmissive area TA. However, this is an example, and the bezel area BZA may be omitted from the window WP according to an embodiment. The window WP may include at least one functional layer of an anti-fingerprint layer, a hard coating layer, and an anti-reflective layer. However, embodiments are not limited thereto.

The display module DM may be disposed under the window WP. The display module DM may have a configuration that substantially generates the image IM. The image IM generated by the display module DM may be displayed through a display surface IS of the display module DM and may be viewed by a user through the transmission area TA.

The display module DM may include a display area DA and a non-display area NDA. The display area DA may be activated in response to electrical signals. The non-display area NDA may be adjacent to the display area DA. The non-display area NDA may surround the display area DA. The non-display area NDA may be covered by the bezel area BZA and may not be viewed from the outside.

As shown in FIG. 2, the display module DM may include a display panel DP and an input sensor INS. For example, the display device DD may include a protective member disposed on a lower surface of the display panel DP or an anti-reflective member and/or a window member disposed on an upper surface of the input sensor INS.

The display panel DP may be a light emitting type display panel, however, embodiments are not limited thereto. For example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a micro-LED. The organic light emitting display panel will be described as the display panel DP.

The display panel DP may include a base layer BL, a circuit element layer DP-CL, a display element layer DP-OLED, and a thin film encapsulation layer TFE. The circuit element layer DP-CL, the display element layer DP-OLED, and the thin film encapsulation layer TFE may be disposed on the base layer BL. The input sensor INS may be disposed (e.g., directly disposed) on the thin film encapsulation layer TFE. In the description, the expression "a component A is disposed directly on a component B" means that no adhesive layers are present between the component B and the component A.

The base layer BL may include at least one plastic film. The base layer BL may be a flexible substrate and may include a plastic substrate, a glass substrate, a metal substrate, or an organic/inorganic composite material substrate. In the description, the display area DA and the non-display area NDA may be defined in the base layer BL, and components arranged on the base layer BL may overlap the display area DA or the non-display area NDA.

The circuit element layer DP-CL may include at least one insulating layer and a circuit element. The insulating layer may include at least one inorganic layer and at least one organic layer. The circuit element may include signal lines and a pixel driving circuit.

The display element layer DP-OLED may include a conductive partition wall (or a conductive bank) and a light emitting element. The light emitting element may include an anode, a light emitting pattern layer, and a cathode, and the light emitting pattern layer may include at least a light emitting layer.

The thin film encapsulation layer TFE may include thin layers. Some thin layers may be disposed to improve an optical efficiency, and some thin layers may be disposed to protect organic light emitting diodes.

The input sensor INS may obtain coordinate information of an external input. The input sensor INS may have a multi-layer structure. The input sensor INS may include a conductive layer having a single-layer or multi-layer structure. The input sensor INS may include an insulating layer having a single-layer or multi-layer structure. The input sensor INS may sense the external input by a capacitive method. The operation method of the input sensor INS should not be limited. The input sensor INS may sense the external input by an electromagnetic induction method or a pressure sensing method. According to an embodiment, the input sensor INS may be omitted.

As shown in FIG. 1B, the housing HAU may be coupled to the window WP. The housing HAU and the window WP coupled to the housing HAU may provide a certain inner space. The display module DM may be accommodated in the inner space.

The housing HAU may include a material with a relatively high rigidity. For example, the housing HAU may include a glass, plastic, or metal material or frames and/or plates of combinations thereof. The housing HAU may stably protect the components of the display device DD accommodated in the inner space from external impacts.

Figure 3A:
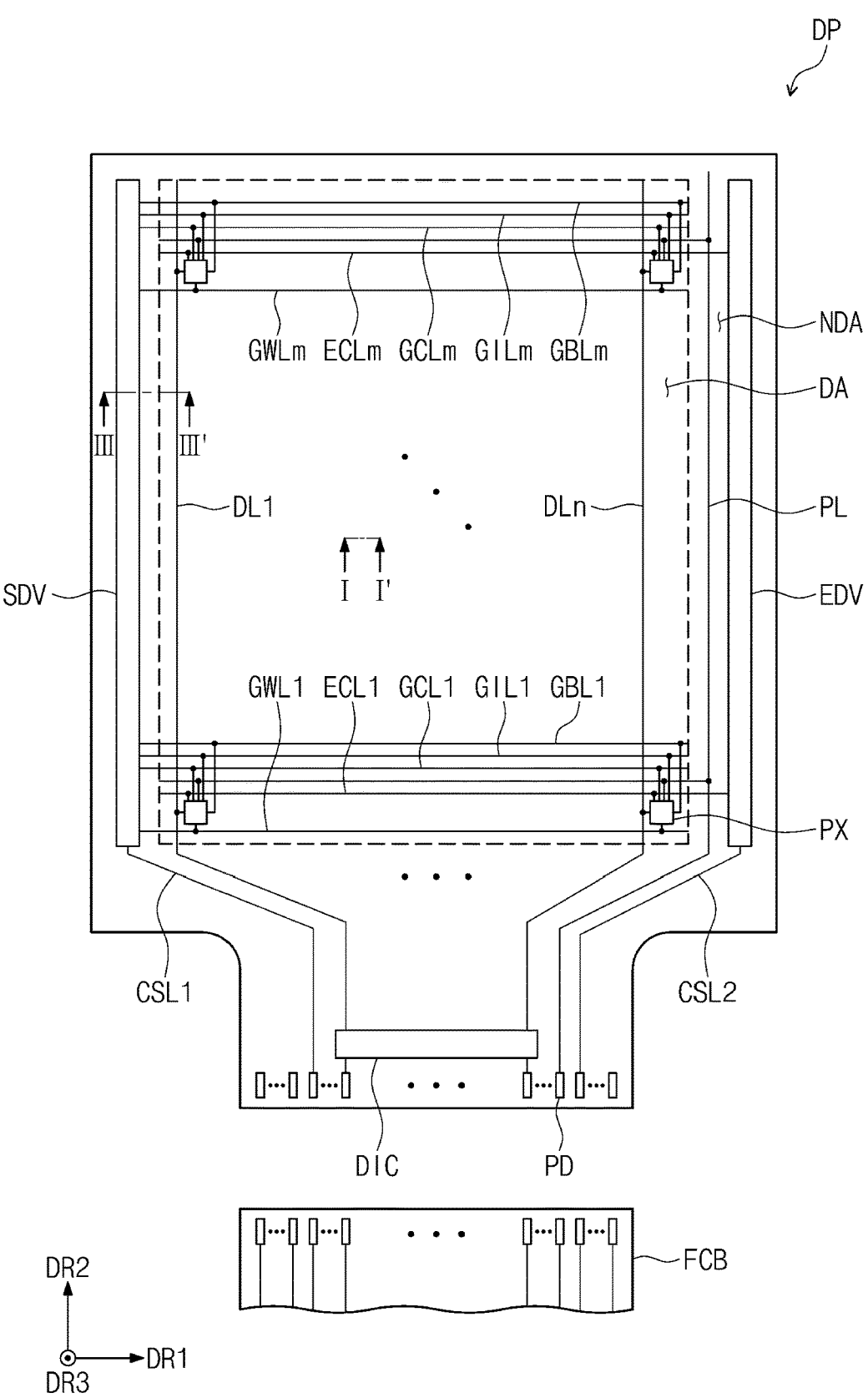
FIG. 3A is a schematic plan view of a display panel according to an embodiment.
Figure 3B:
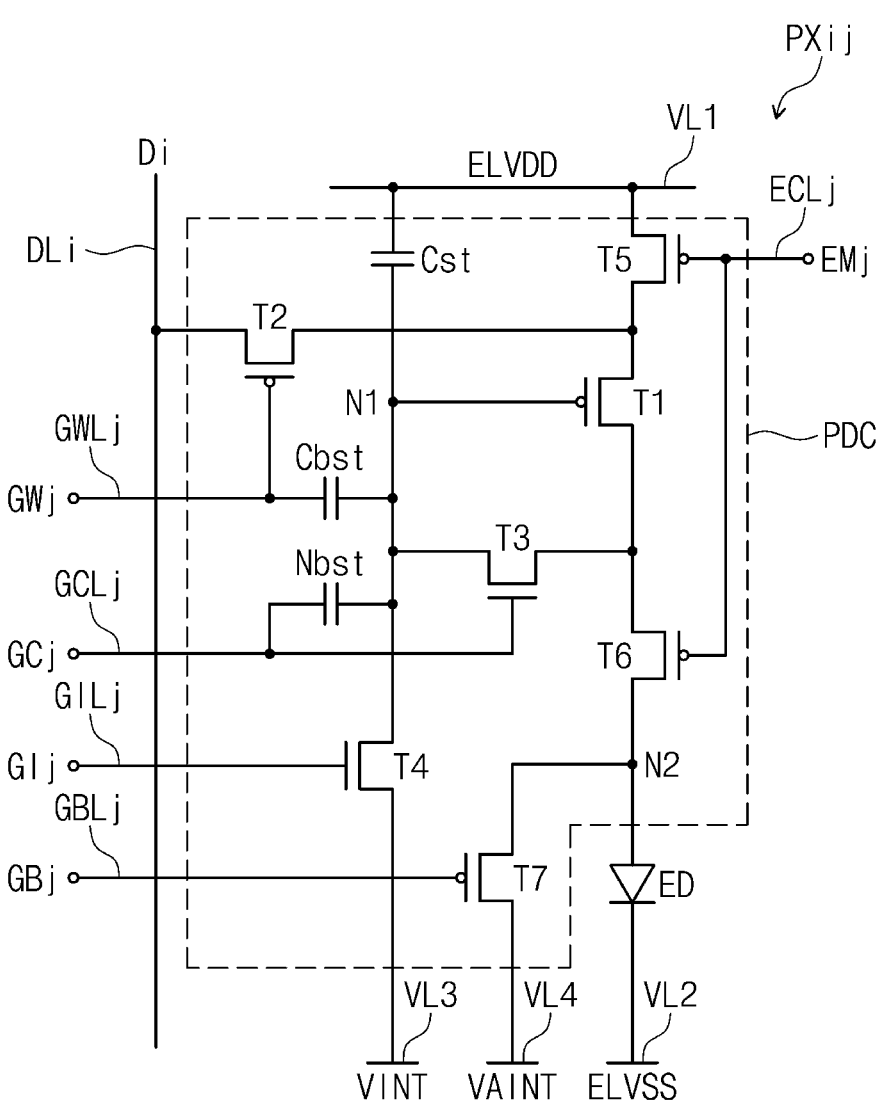
FIG. 3B is a schematic diagram of an equivalent circuit of a pixel according to an embodiment.

FIG. 3A is a schematic plan view of the display panel DP according to an embodiment. FIG. 3B is a schematic diagram of an equivalent circuit of a pixel PXij according to an embodiment.

Referring to FIG. 3A, the display panel DP may include the display area DA and the non-display area NDA around the display area DA. The display area DA and the non-display area NDA may be distinguished from each other by the presence or absence of pixels PX. The pixels PX may be disposed in the display area DA. A scan driver SDV, a data driver, and an emission driver EDV may be disposed in the non-display area NDA. The data driver may be a circuit provided in a driving chip DIC.

The display panel DP may include the pixels PX, initialization scan lines GIL1 to GILm, compensation scan lines GCL1 to GCLm, write scan lines GWL1 to GWLm, black scan lines GBL1 to GBLm, emission control lines ECL1 to ECLm, data lines DL1 to DLn, first and second control lines CSL1 and CSL2, a driving voltage line PL, and pads PD. In an embodiment, each of "m" and "n" is a natural number equal to or greater than 2.

The pixels PX may be connected to the initialization scan lines GIL1 to GILm, the compensation scan lines GCL1 to GCLm, the write scan lines GWL1 to GWLm, the black scan lines GBL1 to GBLm, the emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in the first direction DR1 and may be electrically connected to the scan driver SDV. The data lines DL1 to DLn may extend in the second direction DR2 and may be electrically connected to the driving chip DIC. The emission control lines ECL1 to ECLm may extend in the first direction DR1 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers from each other. The driving voltage line PL may provide a driving voltage to the pixels PX.

The first control line CSL1 may be connected to the scan driver SDV. The second control line CSL2 may be connected to the emission driver EDV.

The driving chip DIC, the driving voltage line PL, the first control line CSL1, and the second control line CSL2 may be electrically connected to the pads PD. A flexible circuit film FCB may be electrically connected to the pads PD through an anisotropic conductive adhesive layer. The pads PD may connect the flexible circuit film FCB to the display panel DP. The pads PD may be connected to corresponding pixels PX via the driving voltage line PL, the first control line CSL1, and the second control line CSL2.

For example, the pads PD may further include input pads. The input pads may connect the flexible circuit film FCB to the input sensor INS (refer to FIG. 2), however, embodiments are not limited thereto or thereby. According to an embodiment, the input pads may be arranged in the input sensor INS (refer to FIG. 2) and may be connected to the pads PD and a separate circuit board. According to an embodiment, the input sensor INS (refer to FIG. 2) may be omitted, and the pads PD may not further include the input pads.

FIG. 3B shows a schematic diagram of an equivalent circuit of the pixel PXij among the pixels PX of FIG. 3A. Since the pixels PX may have substantially the same configuration as each other, the circuit configuration of the pixel PXij will be described in detail, and detailed descriptions of the other pixels will be omitted for descriptive convenience.

Referring to FIGS. 3A and 3B, the pixel PXij may be connected to an i-th data line DLi among the data lines DL1 to DLn, a j-th initialization scan line GILj among the initialization scan lines GIL1 to GILm, a j-th compensation scan line GCLj among the compensation scan lines GCL1 to GCLm, a j-th write scan line GWLj among the write scan lines GWL1 to GWLm, a j-th black scan line GBLj among the black scan lines GBL1 to GBLm, a j-th emission control line ECLj among the emission control lines ECL1 to ECLm, first and second driving voltage lines VL1 and VL2, and first and second initialization voltage lines VL3 and VL4. The "i" may be an integer number equal to or greater than 1 and equal to or smaller than n, and the "j" may be an integer number equal to or greater than 1 and equal to or smaller than m.

The pixel PXij may include a light emitting element ED and a pixel circuit PDC. The light emitting element ED may be a light emitting diode. As an example, the light emitting element ED may be an organic light emitting diode including an organic light emitting layer, however, embodiments are not limited thereto. The pixel circuit PDC may control an amount of current flowing through the light emitting element ED in response to a data signal Di. The light emitting element ED may emit a light with a certain luminance corresponding to the amount of current provided from the pixel circuit PDC.

The pixel circuit PDC may include first, second, third, fourth, fifth, sixth, and seventh transistors T1, T2, T3, T4, T5, T6, and T7 and first, second, and third capacitors Cst, Cost, and Nbst. The configuration of the pixel circuit PDC should not be limited to the embodiment shown in FIG. 3B. The pixel circuit PDC shown in FIG. 3B is an example, and the configuration of the pixel circuit PDC may be changed.

At least one of the first to seventh transistors T1 to T7 may include a low-temperature polycrystalline silicon (LTPS) as its semiconductor layer. At least one of the first to seventh transistors T1 to T7 may include an oxide material as its semiconductor layer. As an example, each of the third and fourth transistors T3 and T4 may be an oxide semiconductor transistor, and each of the first, second, fifth, sixth, and seventh transistors T1, T2, T5, T6, and T7 may be a low-temperature polycrystalline silicon (LTPS) transistor.

The first transistor T1, which directly affects the luminance of the light emitting element ED, may include the semiconductor layer including polycrystalline silicon with high reliability, and thus, the display device with high resolution may be implemented. In a case where at least one of the third transistor T3 and the fourth transistor T4, which are connected to a gate electrode of the first transistor T1, includes an oxide semiconductor, the leakage current may be prevented or minimized from flowing to the gate electrode of the first transistor T1, and power consumption may be reduced.

Some of the first to seventh transistors T1 to T7 may be a P-type transistor, and the other of the first to seventh transistors T1 to T7 may be an N-type transistor. As an example, each of the first, second, fifth, sixth, and seventh transistors T1, T2, T5, T6, and T7 may be the P-type transistor, and each of the third and fourth transistors T3 and T4 may be the N-type transistor.

The configuration of the pixel circuit PDC should not be limited to that shown in FIG. 3B. The pixel circuit PDC shown in FIG. 3B is an example, and the configuration of the pixel circuit PDC may be changed. As an example, all the first to seventh transistors T1 to T7 may be the P-type transistor or the N-type transistor. According to an embodiment, the first, second, fifth, and sixth transistors T1, T2, T5, and T6 may be the P-type transistor, and the third, fourth, and seventh transistors T3, T4, and T7 may be the N-type transistor.

The j-th initialization scan line GILj, the j-th compensation scan line GCLj, the j-th write scan line GWLj, the j-th black scan line GBLj, and the j-th emission control line ECLj may transmit a j-th initialization scan signal GIj, a j-th compensation scan signal GCj, a j-th write scan signal GWj, a j-th black scan signal GBj, and a j-th emission control signal EMj to the pixel PXij, respectively. The i-th data line DLi may transmit an i-th data signal Di to the pixel PXij. The i-th data signal Di may have a voltage level corresponding to the image signal input to the display device DD (refer to FIG. 1A).

The First and second driving voltage lines VL1 and VL2 may transmit a first driving voltage ELVDD and a second driving voltage ELVSS to the pixel PXij, respectively. For example, the first and second initialization voltage lines VL3 and VL4 may transmit a first initialization voltage VINT and a second initialization voltage VAINT to the pixel PXij, respectively.

The first transistor T1 may be connected between the first driving voltage line VL1 receiving the first driving voltage ELVDD and the light emitting element ED. The first transistor T1 may include a first electrode connected to the first driving voltage line VL1 via the fifth transistor T5, a second electrode connected (e.g., electrically connected) to a pixel electrode (or referred to as an anode) of the light emitting element ED via the sixth transistor T6, and a third electrode (e.g., the gate electrode) connected to an end portion (e.g., a first node N1) of the first capacitor Cst. The first transistor T1 may receive the i-th data signal Di transmitted by the i-th data line DLi in response to a switching operation of the second transistor T2 and may supply a driving current to the light emitting element ED.

The second transistor T2 may be connected between the i-th data line DLi and the first electrode of the first transistor T1. The second transistor T2 may include a first electrode connected to the i-th data line DLi, a second electrode connected to the first electrode of the first transistor T1, and a third electrode (e.g., a gate electrode) connected to the j-th write scan line GWLj. The second transistor T2 may be turned on in response to the j-th write scan signal GWj applied thereto via the j-th write scan line GWLj and may transmit the i-th data signal Di applied thereto via the i-th data line DLi to the first electrode of the first transistor T1. An end portion of the second capacitor Cbst may be connected to the third electrode of the second transistor T2, and another end portion of the second capacitor Cbst may be connected to the first node N1.

The third transistor T3 may be connected between the second electrode of the first transistor T1 and the first node N1. The third transistor T3 may include a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on in response to the j-th compensation scan signal GCj applied thereto via the j-th compensation scan line GCLj and may connect the third electrode and the second electrode of the first transistor T1 to each other to allow the first transistor T1 to be connected in a diode configuration. An end portion of the third capacitor Nbst may be connected to the third electrode of the third transistor T3, and another end portion of the third capacitor Nbst may be connected to the first node N1.

The fourth transistor T4 may be connected between the first initialization voltage line VL3 to which the first initialization voltage VINT is applied and the first node N1. The fourth transistor T4 may include a first electrode connected to the first initialization voltage line VL3 to which the first initialization voltage VINT is applied, a second electrode connected to the first node N1, and a third electrode (e.g., a gate electrode) connected to the j-th initialization scan line GILj. The fourth transistor T4 may be turned on in response to the j-th initialization scan signal GIj applied thereto via the j-th initialization scan line GILj. The turned-on fourth transistor T4 may transmit the first initialization voltage VINT to the first node N1 to initialize an electric potential of the third electrode of the first transistor T1, e.g., an electric potential of the first node N1.

The fifth transistor T5 may include a first electrode connected to the first driving voltage line VL1, a second electrode connected to the first electrode of the first transistor T1, and a third electrode (e.g., a gate electrode) connected to the j-th emission control line ECLj. The sixth transistor T6 may include a first electrode connected to a second node N2 (e.g., the second electrode of the first transistor T1), a second electrode connected to the pixel electrode of the light emitting element ED, and a third electrode (e.g., a gate electrode) connected to the j-th emission control line ECLj.

The fifth transistor T5 and the sixth transistor T6 may be substantially simultaneously turned on in response to the j-th emission control signal EMj applied thereto via the j-th emission control line ECLj. The first driving voltage ELVDD applied via the turned-on fifth transistor T5 may be compensated for by the first transistor T1 connected in the diode configuration and may be transmitted to the light emitting element ED via the sixth transistor T6.

The seventh transistor T7 may include a first electrode connected to the second initialization voltage line VL4 to which the second initialization voltage VAINT is applied, a second electrode connected to the second node N2 (e.g., the second electrode of the sixth transistor T6), and a third electrode (e.g., a gate electrode) connected to the j-th black scan line GBLj. The second initialization voltage VAINT may have a voltage level equal to or lower than that of the first initialization voltage VINT.

The end portion of the first capacitor Cst may be connected to the third electrode of the first transistor T1, and another end portion of the first capacitor Cst may be connected to the first driving voltage line VL1. A cathode of the light emitting element ED may be connected to the second driving voltage line VL2 that transmits the second driving voltage ELVSS. The second driving voltage ELVSS may have a voltage level lower than that of the first driving voltage ELVDD.

Figure 4:
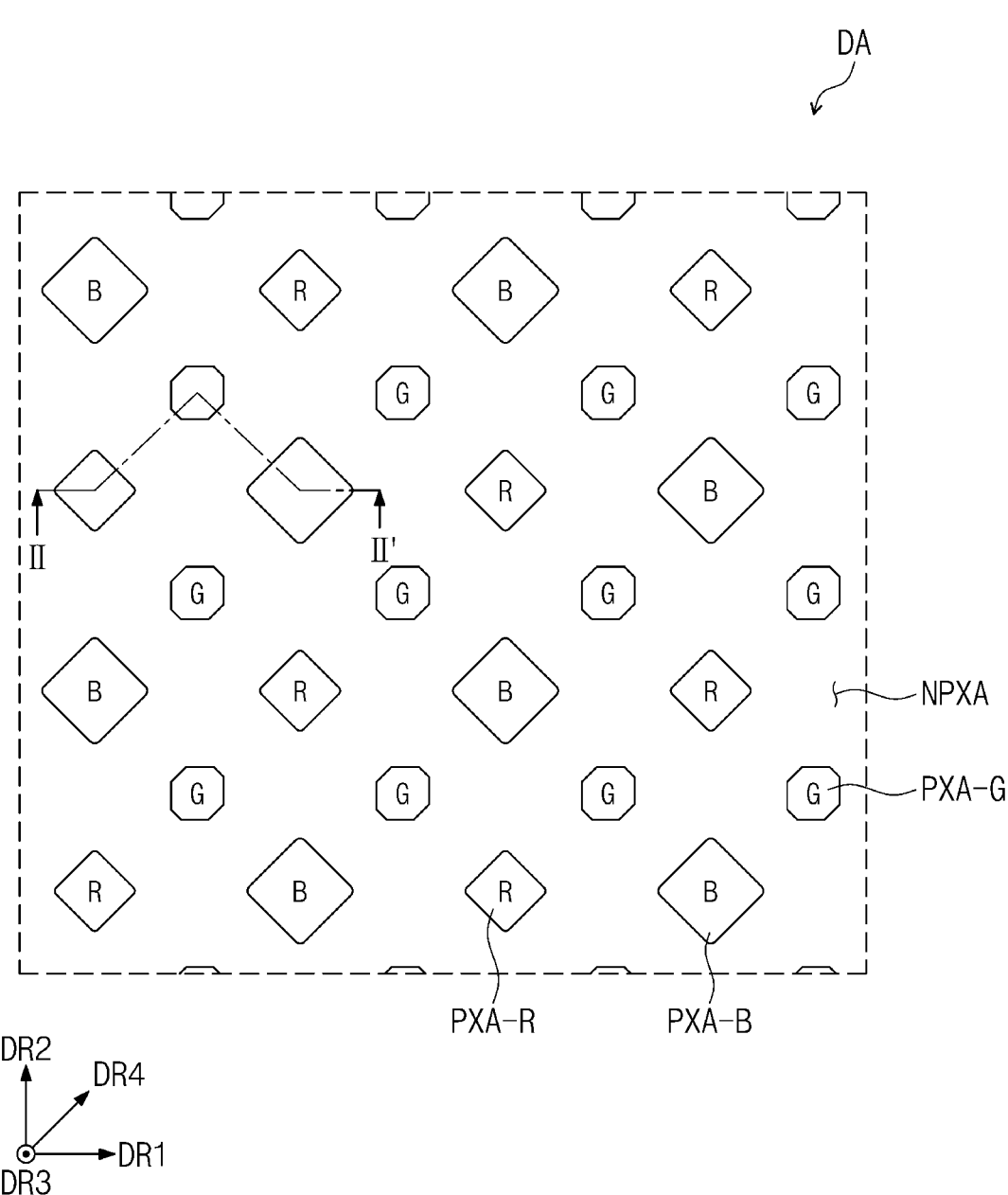
FIG. 4 is an enlarged schematic plan view of a portion of a display area of a display panel according to an embodiment.

FIG. 4 is an enlarged schematic plan view of a portion of the display area DA of the display panel according to an embodiment. FIG. 4 is a schematic plan view showing the display module DM (refer to FIG. 2) when viewed from an upper side of the display surface IS (refer to FIG. 1B) of the display module DM (refer to FIG. 2) and shows an arrangement of light emitting areas PXA-R. PXA-G, and PXA-B.

Referring to FIG. 4, the display area DA may include first, second, and third light emitting areas PXA-R. PXA-G, and PXA-B and a peripheral area NPXA surrounding the first, second, and third light emitting areas PXA-R, PXA-G, and PXA-B. The first, second, and third light emitting areas PXA-R, PXA-G, and PXA-B may respectively correspond to areas from which lights provided from light emitting elements ED1, ED2, and ED3 (refer to FIG. 6) are emitted. The first, second, and third light emitting areas PXA-R, PXA-G, and PXA-B may be distinguished by colors of the lights emitted outward from the display module DM (refer to FIG. 2).

The first, second, and third light emitting areas PXA-R, PXA-G, and PXA-B may respectively provide first, second, and third color lights having colors different from each other. As an example, the first color light may be a red light, the second color light may be a green light, and the third color light may be a blue light. However, the first, second, and third color lights should not be limited thereto or thereby.

Each of the first, second, and third light emitting areas PXA-R, PXA-G, and PXA-B may be defined as an area through which an upper surface of the anode is exposed by a light emitting opening described below. The peripheral area NPXA may define a boundary area between the first, second, and third light emitting areas PXA-R, PXA-G, and PXA-B and may prevent a mixture of the colors of the lights traveling between the first, second, and third light emitting areas PXA-R, PXA-G, and PXA-B.

Each of the first, second, and third light emitting areas PXA-R, PXA-G, and PXA-B may be provided in plural and may be repeatedly arranged in a certain arrangement within the display area DA. As an example, the first and third light emitting areas PXA-R and PXA-B may be alternately arranged with each other in the first direction DR1 to form a first group. The second light emitting areas PXA-G may be arranged in the first direction DR1 to form a second group. Each of the first group and the second group may be provided in plural, and the first groups may be alternately arranged with the second groups in the second direction DR2.

One second light emitting area PXA-G may be disposed spaced apart from one first light emitting area PXA-R or one third light emitting area PXA-B in a fourth direction DR4. The fourth direction DR4 may correspond to a direction between the first and second directions DR1 and DR2.

FIG. 4 shows a representative example of the arrangement of the first, second, and third light emitting areas PXA-R, PXA-G, and PXA-B, however, the arrangement of the first, second, and third light emitting areas PXA-R, PXA-G, and PXA-B should not be limited and may be changed in various ways. The first, second, and third light emitting areas PXA-R, PXA-G, and PXA-B may be arranged in a pentile pattern (e.g., PENTILE™) as shown in FIG. 4. According to an embodiment, the first, second, and third light emitting areas PXA-R, PXA-G, and PXA-B may be arranged in a stripe pattern or a diamond pattern (e.g., Diamond Pixel™).

Each of the first, second, and third light emitting areas PXA-R, PXA-G, and PXA-B may have a variety of shapes in a plan view. As an example, each of the first, second, and third light emitting areas PXA-R, PXA-G, and PXA-B may have a polygonal shape, a circular shape, or an oval shape. In FIG. 4, the first and third light emitting areas PXA-R and PXA-B each having a quadrangular shape or a lozenge shape and the second light emitting area PXA-G having an octagonal shape are shown as a representative example.

The first, second, and third light emitting areas PXA-R, PXA-G, and PXA-B may have substantially the same shape as each other in a plan view, or at least one of the first, second, and third light emitting areas PXA-R, PXA-G, and PXA-B may have a shape different from the others. FIG. 4 shows a structure in which the first and third light emitting areas PXA-R and PXA-B have the same shape as each other in a plan view and the second light emitting area PXA-G may have the shape different from that of the first and third light emitting areas PXA-R and PXA-B as a representative example.

At least one of the first, second, and third light emitting areas PXA-R, PXA-G, and PXA-B may have a size different from those of the others in a plan view. The size of the first light emitting area PXA-R emitting the red light may be greater than the size of the second light emitting area PXA-G emitting the green light and may be smaller than the size of the third light emitting area PXA-B emitting the blue light. However, a size relationship between the first, second, and third light emitting areas PXA-R, PXA-G, and PXA-B according to the colors of the lights should not be limited thereto or thereby and may be changed in various ways according to a design of the display module DM (refer to FIG. 2). For example, according to an embodiment, the first, second, and third light emitting areas PXA-R, PXA-G, and PXA-B may have substantially the same size as each other in a plan view.

The shape, size, and arrangement of the first, second, and third light emitting areas PXA-R, PXA-G, and PXA-B of the display module DM (refer to FIG. 2) may be variously designed according to the colors of the emitted lights, the size of the display module DM (refer to FIG. 2), and the configuration of the display module DM (refer to FIG. 2), however, they should not be limited to the embodiment shown in FIG. 4.

Figure 5:
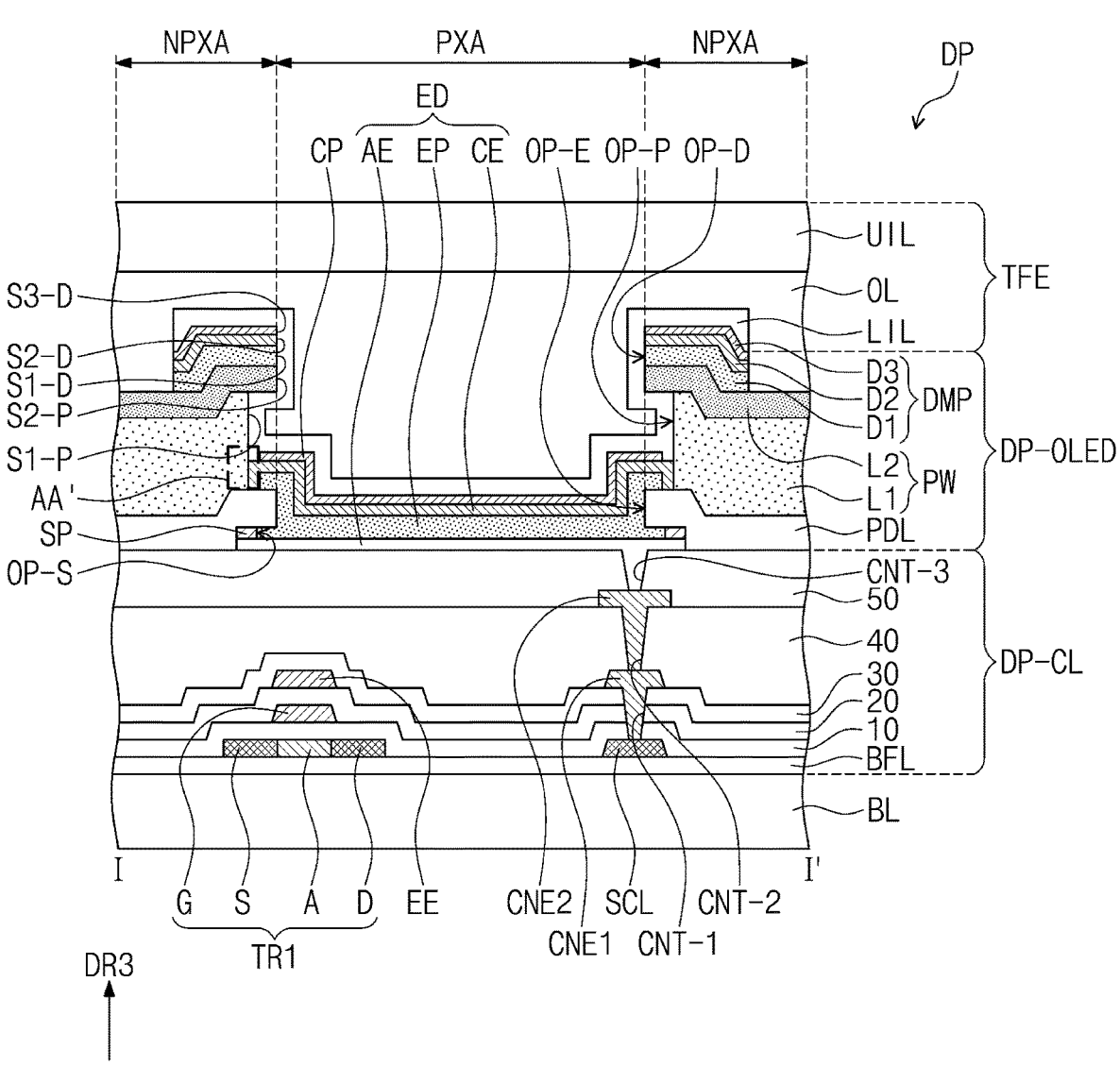
FIG. 5 is a schematic cross-sectional view of a display panel taken along line I-I' of FIG. 3A according to an embodiment.
Figure 6:
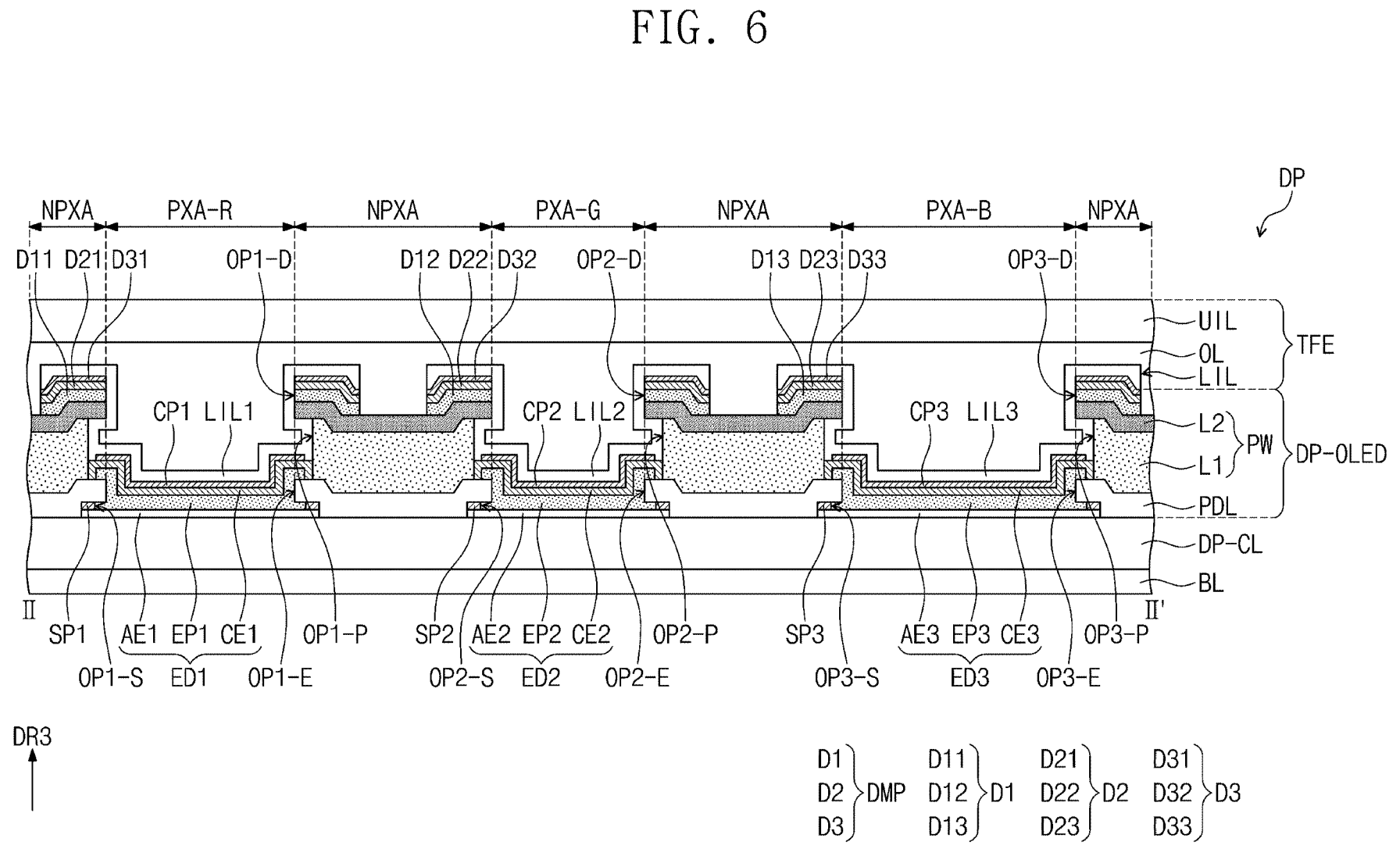

FIG. 5 is a schematic cross-sectional view of the display panel DP taken along line I-I' of FIG. 3A according to an embodiment. FIG. 6 is a schematic cross-sectional view of the display panel DP taken along line II-II' of FIG. 4 according to an embodiment.

FIG. 5 is an enlarged schematic view of one light emitting area PXA of the display area DA (refer to FIG. 3A), and the light emitting area PXA of FIG. 5 may correspond to one of the first, second, and third light emitting areas PXA-R, PXA-G, and PXA-B of FIG. 4. Referring to FIG. 5, the display panel DP may include a base layer BL, a circuit element layer DP-CL, a display element layer DP-OLED, and a thin film encapsulation layer TFE.

The display panel DP may include insulating layers, a semiconductor pattern layer, a conductive pattern layer, and a signal line. An insulating layer, a semiconductor layer, and a conductive layer may be formed by a coating process or a depositing process. For example, the insulating layer, the semiconductor layer, and the conductive layer may be selectively patterned by a photolithography process and an etching process. The semiconductor pattern layer, the conductive pattern layer, and the signal line included in the circuit element layer CL and the display element layer DP-OLED may be formed through the above processes.

The circuit element layer DP-CL may be disposed on the base layer BL. The circuit element layer DP-CL may include a buffer layer BFL, a transistor TR1, a signal transmission area SCL, first, second, third, fourth, and fifth insulating layers 10, 20, 30, 40, and 50, an electrode EE, and connection electrodes CNE1 and CNE2.

The buffer layer BFL may be disposed on the base layer BL. The buffer layer BFL may increase an adhesion between the base layer BL and the semiconductor pattern layer. The buffer layer BFL may include a silicon oxide layer and a silicon nitride layer, and the silicon oxide layer and the silicon nitride layer may be alternately stacked with each other.

The semiconductor pattern layer may be disposed on the buffer layer BFL. The semiconductor pattern layer may include polysilicon, however, embodiments are not limited thereto or thereby. The semiconductor pattern layer may include an amorphous silicon or metal oxide. FIG. 5 shows a portion of the semiconductor pattern layer, and the semiconductor pattern layer may be further disposed in the light emitting areas PXA-R, PXA-G, and PXA-B (refer to FIG. 4). The semiconductor pattern layer may be arranged according to a specific rule over the light emitting areas PXA-R, PXA-G, and PXA-B (refer to FIG. 4). The semiconductor pattern layer may have different electrical properties according to whether it is doped or not or whether it is doped with an N-type dopant or a P-type dopant. The semiconductor pattern layer may include a first region having a relatively high doping concentration and a second region having a relatively low doping concentration. The first region may be doped with the N-type dopant or the P-type dopant. A P-type transistor may include the first region doped with the P-type dopant.

The first region may have a conductivity greater than that of the second region and may substantially serve as an electrode or a signal line. The second region may substantially correspond to an active region (or a channel) of the transistor. For example, a portion of the semiconductor pattern layer may be the active region of the transistor, another portion of the semiconductor pattern layer may be a source or a drain of the transistor, and the other portion of the semiconductor pattern layer may be a conductive area.

A source S, an active region A, and a drain D of the transistor TR1 may be formed from the semiconductor pattern layer. FIG. 5 shows a portion of the signal transmission area SCL formed from the semiconductor pattern layer. For example, the signal transmission area SCL may be connected to the drain D of the transistor TR1 in a plan view.

The first, second, third, fourth, and fifth insulating layers 10, 20, 30, 40, and 50 may be disposed on the buffer layer BFL. Each of the first to fifth insulating layers 10 to 50 may be an inorganic layer or an organic layer.

The first insulating layer 10 may be disposed on the buffer layer BFL. A gate G may be disposed on the first insulating layer 10. The second insulating layer 20 may be disposed on the first insulating layer 10 and may cover the gate G. The electrode EE may be disposed on the second insulating layer 20. The third insulating layer 30 may be disposed on the second insulating layer 20 and may cover the electrode EE.

A first connection electrode CNE1 may be disposed on the third insulating layer 30. The first connection electrode CNE1 may be connected to the signal transmission area SCL via a contact hole CNT-1 defined (or formed) through the first, second, and third insulating layers 10, 20, and 30. The fourth insulating layer 40 may be disposed on the third insulating layer 30 and may cover the first connection electrode CNE1. The fourth insulating layer 40 may be an organic layer.

A second connection electrode CNE2 may be disposed on the fourth insulating layer 40. The second connection electrode CNE2 may be connected to the first connection electrode CNE1 via a contact hole CNT-2 defined (or formed) through the fourth insulating layer 40. The fifth insulating layer 50 may be disposed on the fourth insulating layer 40 and may cover the second connection electrode CNE2. The fifth insulating layer 50 may be an organic layer.

The display element layer DP-OLED may be disposed on the circuit element layer DP-CL. The display element layer DP-OLED may include the light emitting element ED, a sacrificial pattern layer SP, a pixel definition layer PDL, a bank (e.g., partition wall or definition wall) PW, and dummy pattern layers DMP.

The light emitting element ED may include an anode AE (or a first electrode), a light emitting pattern layer EP, and a cathode CE (or a second electrode). Each of the first to third light emitting elements described above may have substantially the same configuration as that of the light emitting element ED of FIG. 5. Descriptions on the anode AE, the light emitting pattern layer EP, and the cathode CE may be equally applied to the anode, the light emitting pattern layer, and the cathode of each of the first to third light emitting elements.

The anode AE may be disposed on the fifth insulating layer 50 of the circuit element layer DP-CL. The anode AE may be a transmissive electrode (e.g., light-transmissive electrode), a semi-transmissive electrode (e.g., semi-light-transmissive electrode), or a reflective electrode (e.g., light-reflective electrode). The anode AE may have a conductivity. As an example, the anode AE may be formed from a variety of materials, such as metals, transparent conductive oxides (TCOs), or conductive polymer materials, as long as they have conductivity.

The anode AE may be connected to the second connection electrode CNE2 via a connection contact hole CNT-3 defined (or formed) through the fifth insulating layer 50. Accordingly, the anode AE may be connected (e.g., electrically connected) to the signal transmission area SCL via the first and second connection electrodes CNE1 and CNE2 and may be connected (e.g., electrically connected) to a corresponding circuit element.

The sacrificial pattern layer SP may be disposed on an upper surface of the anode AE. A sacrificial opening OP-S may be defined (or formed) through the sacrificial pattern layer SP, and a portion of the upper surface of the anode AE may be exposed through the sacrificial opening OP-S. The sacrificial pattern layer SP may include an amorphous transparent conductive oxide.

The pixel definition layer PDL may be disposed on the fifth insulating layer 50 of the circuit element layer DP-CL. The pixel definition layer PDL may be provided with a light emitting opening OP-E defined (or formed) therethrough. The light emitting opening OP-E may overlap the anode AE, and at least a portion of the anode AE may be exposed through the light emitting opening OP-E of the pixel definition layer PDL.

For example, the light emitting opening OP-E may correspond to the sacrificial opening OP-S of the sacrificial pattern layer SP. According to an embodiment, the upper surface of the anode AE may be spaced apart from the pixel definition layer PDL with the sacrificial pattern layer SP interposed therebetween when viewed in a cross-section, and thus, the anode AE may be prevented from being damaged in a process of forming the light emitting opening OP-E.

In a plan view, a size of the light emitting opening OP-E may be smaller than a size of the sacrificial opening OP-S. For example, an inner side surface of the pixel definition layer PDL, which defines (or forms) the light emitting opening OP-E, may be closer to a center of the anode AE than an inner side surface of the sacrificial pattern layer SP, which defines (or forms) the sacrificial opening OP-S, is. However, embodiments are not limited thereto or thereby. According to an embodiment, the inner side surface of the sacrificial pattern layer SP, which defines (or forms) the sacrificial opening OP-S, may be substantially aligned with the inner side surface of the pixel definition layer PDL, which defines (or forms) the corresponding light emitting opening OP-E. For example, the light emitting area PXA may be an area of the anode AE exposed without being covered by the corresponding sacrificial opening OP-S.

The pixel definition layer PDL may include an inorganic insulating material, e.g., silicon nitride ($SiN_x$). The pixel definition layer PDL may be disposed between the anode AE and the bank PW and may block the anode AE from being electrically connected to the bank PW.

The bank PW may be disposed on the pixel definition layer PDL. The bank PW may be provided with a bank opening OP-P defined (or formed) therethrough. The bank opening OP-P may correspond to the light emitting opening OP-E, and at least a portion of the anode AE may be exposed through the bank opening OP-P.

The bank PW may have an undercut shape in the cross-section. The bank PW may include a plurality of layers sequentially stacked, and at least one of the layers may be recessed relative to adjacent layers. Accordingly, the bank PW may include a tip portion.

In an embodiment, the bank PW may include a first layer L1 and a second layer L2. The first layer L1 may be disposed on the pixel definition layer PDL, and the second layer L2 may be disposed on the first layer L1. The first layer L1 may have a first conductivity, and the second layer L2 may have a second conductivity lower than the first conductivity. The first layer L1 may have a thickness greater than a thickness of the second layer L2. An etch rate of the first layer L1 may be greater than an etch rate of the second layer L2.

In an embodiment, the first layer L1 may be recessed relative to the second layer L2 with respect to the light emitting area PXA. For example, the second layer L2 may protrude toward the light emitting area PXA as compared to the first layer L1. For example, the first layer L1 may have an undercut shape with respect to the second layer L2. The bank opening OP-P defined (or formed) through the bank PW may include a first area A1 (refer to FIG. 9F) and a second area A2 (refer to FIG. 9F), which are sequentially arranged in the third direction DR3. The first layer L1 may include a first inner side surface S1-P that defines a first area A1 (refer to FIG. 9F) of the bank opening OP-P, and the second layer L2 may include a second inner side surface S2-P that defines a second area A2 (refer to FIG. 9F) of the bank opening OP-P.

The first inner side surface S1-P of the first layer L1 may be recessed inward relative to the second inner side surface S2-P of the second layer L2 with respect to the light emitting area PXA. For example, the first inner side surface S1-P may have an undercut shape with respect to the second inner side surface S2-P. A portion of the second layer L2, which protrudes from the first layer L1 to the light emitting area PXA, may be formed as the tip portion.

Each of the first layer L1 and the second layer L2 may include a conductive material. In an embodiment, the first layer L1 may include a metal material, e.g., an alloy. According to an embodiment, the first layer L1 may include an AlNiLa alloy. As an example, the AlNiLa alloy may be an aluminum-based alloy doped with nickel (Ni) and lanthanum (La). For example, a content of nickel (Ni) may be equal to or greater than about 0.5 at % and equal to or smaller than about 3.0 at %, and a content of lanthanum (La) may be equal to or greater than about 0.1 at % and equal to or smaller than about 0.5 at %.

In an embodiment, the first layer L1 may include an $Al_xNi$ phase. The first layer L1 may be formed by a deposition process at a high temperature, and the $Al_xNi$ phase may be formed in the first layer L1 that is heat-treated at a high temperature. Accordingly, the first layer L1 may reduce a contact resistance of the cathode CE, and an electrical reliability of the light emitting element ED may be improved. This will be described in detail below.

In an embodiment, the second layer L2 may include a metal oxide, for example, an alloy oxide. According to an embodiment, the second layer L2 may include a MoTa alloy oxide. As an example, the MoTa alloy oxide may be a molybdenum-based alloy oxide doped with tantalum (Ta). For example, a content of tantalum (Ta) may be equal to or greater than about 1.0 at % and equal to or smaller than about 15.0 at %.

According to an embodiment, as the second layer L2 includes the MoTa alloy oxide, the second layer L2 may absorb an external light. For example, since the second layer L2 includes the MoTa alloy oxide and the first layer L1 includes the aluminum-based alloy, a light of the external light, which is reflected by an upper surface of the second layer L2, and a light of the external light, which is reflected by an upper surface of the first layer L1, may be offset to each other. Accordingly, a reflectance of the bank PW with respect to the external light may be reduced, and a display quality of the display panel DP may be improved.

In the case where the second layer L2 includes the MoTa alloy oxide, the reflectance of the bank PW with respect to the external light in a visible light wavelength range, e.g., 550 nm, may be equal to or smaller than about 29.5%. For example, according to a comparative example where the second layer L2 includes a single metal of titanium (Ti), the reflectance of the bank PW with respect to the external the light in the visible light wavelength range, e.g., about 550 nm, may be about 52%. For example, according to an embodiment, the reflectance of the bank PW with respect to the external light may be lower than that of the comparative example.

The thickness of the first and second layers L1 and L2 may be set to a range that reduces the reflectance of the second layer L2. According to an embodiment, the first layer L1 may have the thickness equal or greater than about 6,000 angstroms (Å) and equal to or smaller than about 100,000 angstroms (Å). The second layer L2 may have the thickness equal to or greater than about 400 angstroms (Å) and equal to or smaller than about 800 angstroms (Å).

TABLE 1

| | 450 Å | 500 Å | 550 Å | 600 Å | 650 Å | 700 Å | 750 Å | 800 Å |
|---|---|---|---|---|---|---|---|---|
| 550 nm reflectance[%] | 0.1 | 1.5 | 5.5 | 11.6 | 17.5 | 22.4 | 26.5 | 29.5 |
| Average reflectance[%] | 11.2 | 9.7 | 10.9 | 13.7 | 17.1 | 20.3 | 22.9 | 24.7 |

Table 1 shows data values obtained by measuring the reflectance for the light having the wavelength of about 550 nm and an average reflectance for an entire wavelength range in various embodiments of the bank PW formed by varying the thickness of the second layer L2 including the MoTa alloy oxide.

Referring to Table 1, it is observed that the reflectance for the light having the wavelength of about 550 nm is equal to or greater than about 0.1% and equal to or smaller than about 29.5%. Accordingly, in case that the second layer L2 has the thickness equal to or greater than about 450 angstroms (Å) and equal to or smaller than about 800 angstroms (Å), it is observed that the reflectance is lower in the visible light wavelength range than that of the comparative example in which the second layer L2 includes the single metal of titanium (Ti).

For example, in case that the second layer L2 has the thickness equal to or greater than about 450 angstroms (Å) and equal to or smaller than about 500 angstroms (Å), it is observed that the reflectance for the light having the wavelength of about 550 nm is equal to or greater than about 0.1% and equal to or smaller than about 1.5% and it is observed that the reflectance is reduced from about 0.0019 times to about 0.03 times compared to the comparative example in which the second layer L2 includes the single metal of titanium (Ti). Accordingly, the thickness of the second layer L2 may be equal to or greater than about 450 angstroms (Å) and equal to or smaller than about 500 angstroms (Å). For example, it is appropriate to destructively interfere the external light, and the bank PW may have a low level of reflectance that is less than about 5% in the visible light wavelength range.

Referring to Table 1, it is observed that the average reflectance for the light in the entire wavelength range is equal to or greater than about 9.7% and equal to or smaller than about 24.7%. Accordingly, in case that the second layer L2 has the thickness equal to or greater than about 450 angstroms (Å) and equal to or smaller than about 800 angstroms (Å), it is observed that the reflectance is lower in the entire wavelength range than that of the comparative example in which the second layer L2 includes the single metal of titanium (Ti).

FIG. 5 shows a structure in which each of the first and second inner side surfaces S1-P and S2-P is disposed perpendicular to an upper surface of the pixel definition layer PDL as a representative example, however, embodiments are not limited thereto or thereby. According to an embodiment, the bank PW may have a tapered shape or a reverse tapered shape.

The light emitting pattern layer EP may be disposed on the anode AE. The light emitting pattern layer EP may include the light emitting layer including a light emitting material. The light emitting pattern layer EP may further include a hole injection layer and a hole transport layer between the anode AE and the light emitting layer and may further include an electron transport layer and an electron injection layer, which are disposed on the light emitting layer. The light emitting pattern layer EP may be referred to as an organic layer or an intermediate layer.

The light emitting pattern layer EP may be patterned by the tip portion defined in the bank PW. The light emitting pattern layer EP may be disposed inside the sacrificial opening OP-S, the light emitting opening OP-E, and the bank opening OP-P. The light emitting pattern layer EP may cover the portion of the upper surface of the pixel definition layer PDL, which is exposed without being covered by the bank opening OP-P.

The cathode CE may be disposed on the light emitting pattern layer EP. The cathode CE may be patterned by the tip portion defined in the bank PW. The cathode CE may be in contact with the first inner side surface S1-P of the first layer L1. The cathode CE may have the conductivity. As an example, the cathode CE may be formed from the variety of materials, such as metals, transparent conductive oxides (TCOs), or conductive polymer materials, as long as they have conductivity.

In an embodiment, the bank PW may receive a bias voltage. As an example, the bank PW may receive the second driving voltage ELVSS (refer to FIG. 3B), the cathode CE may be connected (e.g., electrically connected) to the bank PW, and thus, the cathode CE may receive the second driving voltage ELVSS (refer to FIG. 3B).

FIG. 5 shows a structure in which the light emitting pattern layer EP is not in contact with the first inner side surface S1-P of the first layer L1 as a representative example, however, embodiments are not limited thereto or thereby. The light emitting pattern layer EP may also be in contact with the first inner side surface S1-P of the first layer L1 together with the cathode CE.

According to an embodiment, the display panel DP may further include a capping pattern layer CP. The capping pattern layer CP may be disposed in the bank opening OP-P and may be disposed on the cathode CE. The capping pattern layer CP may be patterned by the tip portion formed in the bank PW.

FIG. 5 shows a structure in which the capping pattern layer CP is not in contact with the first inner side surface S1-P of the first layer L1 as a representative example, however, embodiments are not limited thereto or thereby.

According to an embodiment, the capping pattern layer CP may be formed to be in contact with the first inner side surface S1-P of the first layer L1. According to an embodiment, the capping pattern layer CP may be omitted.

The dummy pattern layers DMP may be disposed on the bank PW. The dummy pattern layers DMP may include a first dummy pattern layer D1, a second dummy pattern layer D2, and a third dummy pattern layer D3. The first, second, and third dummy pattern layers D1, D2, and D3 may be sequentially stacked on the upper surface of the second layer L2 of the bank PW in the third direction DR3.

The first dummy pattern layer D1 may include an organic material. As an example, the first dummy pattern layer D1 and the light emitting pattern layer EP may include the same material. The first dummy pattern layer D1 and the light emitting pattern layer EP may be substantially simultaneously formed together by a single process and may be separated from the light emitting pattern layer EP due to the undercut shape of the bank PW.

The second dummy pattern layer D2 may include a conductive material. As an example, the second dummy pattern layer D2 and the cathode CE may include the same material. The second dummy pattern layer D2 and the cathode CE may be substantially simultaneously formed together by a single process and may be separated from the cathode CE due to the undercut shape of the bank PW.

The third dummy pattern layer D3 and the capping pattern layer CP may include the same material. The third dummy pattern layer D3 and the capping pattern layer CP may be substantially simultaneously formed by a single process. The third dummy pattern layer D3 may be separated from the capping pattern layer CP due to the undercut shape of the bank PW.

A dummy opening OP-D may be defined (or formed) by the dummy pattern layers DMP. The dummy opening OP-D may correspond to the light emitting opening OP-E. The dummy opening OP-D may include first, second, and third areas AA1, AA2, and AA3 (refer to FIG. 9I) sequentially arranged in the third direction DR3. The first dummy pattern layer D1 may include a first inner side surface S1-D that defines the first area AA1 (refer to FIG. 9I) of the dummy opening OP-D, and the second dummy pattern layer D2 may include a second inner side surface S2-D that defines the second area AA2 (refer to FIG. 9I) of the dummy opening OP-D, and the third dummy pattern layer D3 may include a third inner side surface S3-D that defines the third area AA3 (refer to FIG. 9I) of the dummy opening OP-D. In a plan view, each of the first, second, and third dummy pattern layers D1, D2, and D3 may have a closed-line shape surrounding the light emitting area PXA.

FIG. 5 shows a structure in which the first, second, and third inner side surfaces S1-D, S2-D, and S3-D of the first, second, and third dummy pattern layers D1, D2, and D3 are aligned with the second inner side surface S2-P of the second layer L2 as a representative example, however, embodiments are not limited thereto or thereby. According to an embodiment, the first, second, and third dummy pattern layers D1, D2, and D3 may cover the second inner side surface S2-P of the second layer L2.

The thin film encapsulation layer TFE may be disposed on the display element layer DP-OLED. The thin film encapsulation layer TFE may include a lower encapsulation inorganic pattern layer LIL, an encapsulation organic layer OL, and an upper encapsulation inorganic layer UIL.

The lower encapsulation inorganic pattern layer LIL may be disposed to correspond to the light emitting opening OP-E. The lower encapsulation inorganic pattern layer LIL may cover the light emitting element ED and the dummy pattern layers DMP. A portion of the lower encapsulation inorganic pattern layer LIL may be disposed inside the bank opening OP-P. According to an embodiment, the lower encapsulation inorganic pattern layer LIL may be in contact with the first inner side surface S1-P of the first layer L1.

The encapsulation organic layer OL may cover the lower encapsulation inorganic pattern layer LIL and may provide a flat upper surface thereon. The upper encapsulation inorganic layer UIL may be disposed on the encapsulation organic layer OL.

The lower encapsulation inorganic pattern layer LIL and the upper encapsulation inorganic layer UIL may protect the display element layer DP-OLED from moisture and oxygen, and the encapsulation organic layer OL may protect the display element layer DP-OLED from a foreign substance such as dust particles.

FIG. 6 is an enlarged schematic cross-sectional view of one first light emitting arca PXA-R, one second light emitting area PXA-G, and one third light emitting arca PXA-B, and the above-descriptions on the light emitting area PXA of FIG. 5 may be equally applied to the first, second, and third light emitting areas PXA-R, PXA-G, and PXA-B.

Referring to FIG. 6, the display panel DP may include the base layer BL, the circuit element layer DP-CL, the display element layer DP-OLED, and the thin-film encapsulation layer TFE. The display element layer DP-OLED may include the light emitting elements ED1. ED2, and ED3, sacrificial pattern layers SP1, SP2, and SP3, the pixel definition layer PDL, the bank PW, and the dummy pattern layers DMP.

The light emitting elements ED1, ED2, and ED3 may include a first light emitting element ED1, a second light emitting element ED2, and a third light emitting element ED3.

The first light emitting element ED1 may include a first anode AE1 (or a first-first electrode), a first light emitting pattern layer EP1, and a first cathode CE1 (or a second-first electrode), the second light emitting element ED2 may include a second anode AE2 (or a first-second electrode), a second light emitting pattern layer EP2, and a second cathode CE2 (or a second-second electrode), and the third light emitting element ED3 may include a third anode AE3 (or a first-third electrode), a third light emitting pattern layer EP3, and a third cathode CE3 (or a second-third electrode). The first, second, and third anodes AE1, AE2, and AE3 may be provided in plural pattern layers. The first light emitting pattern layer EP1 may emit the red light, the second light emitting pattern layer EP2 may emit the green light, and the third light emitting pattern layer EP3 may emit the blue light.

In an embodiment, first, second, and third light emitting openings OP1-E, OP2-E, and OP3-E may be defined (or formed) by the pixel definition layer PDL.

The first light emitting opening OP1-E may expose at least a portion of the first anode AE1. The first light emitting area PXA-R may be defined as an area of an upper surface of the first anode AE1, which is exposed through the first light emitting opening OP1-E. The second light emitting opening OP2-E may expose at least a portion of the second anode AE2. The second light emitting area PXA-G may be defined as an area of an upper surface of the second anode AE2, which is exposed through the second light emitting opening OP2-E. The third light emitting opening OP3-E may expose at least a portion of the third anode AE3. The third light emitting area PXA-B may be defined as an area of an upper surface of the third anode AE3, which is exposed through the third light emitting opening OP3-E.

In an embodiment, the sacrificial pattern layers SP1, SP2, and SP3 may include a first sacrificial pattern layer SP1, a second sacrificial pattern layer SP2, and a third sacrificial pattern layer SP3. The first, second, and third sacrificial pattern layers SP1, SP2, and SP3 may be disposed on the upper surfaces of the first, second, and third anodes AE1, AE2, and AE3, respectively. First, second, and third sacrificial openings OP1-S, OP2-S, and OP3-S may be defined (or formed) by the first, second, and third sacrificial pattern layers SP1, SP2, and SP3 to respectively correspond to the first, second, and third light emitting openings OP1-E, OP2-E, and OP3-E.

In an embodiment, first, second, and third bank openings OP1-P, OP2-P, and OP3-P may be defined (or formed) by the bank PW to respectively correspond to (or to overlap) the first, second, and third light emitting openings OP1-E, OP2-E, and OP3-E. Each of the first, second, and third bank openings OP1-P, OP2-P, and OP3-P may include the first area A1 (refer to FIG. 9F) and the second area A2 (refer to FIG. 9F).

The first layer L1 may include the first inner side surfaces S1-P (refer to FIG. 5) that define the first areas A1 (refer to FIG. 9F) of the first, second, and third bank openings OP1-P, OP2-P, and OP3-P, and the second layer L2 may include the second inner side surfaces S2-P (refer to FIG. 5) that define the second areas A2 (refer to FIG. 9F) of the first, second, and third bank openings OP1-P. OP2-P, and OP3-P.

The first light emitting pattern layer EP1 and the first cathode CE1 may be disposed in the first bank opening OP1-P, the second light emitting pattern layer EP2 and the second cathode CE2 may be disposed in the second bank opening OP2-P, and the third light emitting pattern layer EP3 and the third cathode CE3 may be disposed in the third bank opening OP3-P. The first, second, and third cathodes CE1, CE2, and CE3 may be in contact with the first inner side surfaces S1-P (refer to FIG. 5) of the first layer L1, respectively.

In an embodiment, the first, second, and third cathodes CE1, CE2, and CE3 may be separated (e.g., physically separated) from each other by the second layer L2 forming the tip portion, may be respectively formed in the light emitting openings OP1-E, OP2-E, and OP3-E, and may be in contact with the first layer L1. Accordingly, the first, second, and third cathodes CE1, CE2, and CE3 may be electrically connected to each other and may receive a common voltage. As the first layer L1 has a relatively high electrical conductivity and a large thickness compared to the second layer L2, a contact resistance between the first layer L1 and the first, second, and third cathodes CE1, CE2, and CE3 may be reduced. Thus, a common cathode voltage may be provided evenly to the light emitting areas PXA-R, PXA-G, and PXA-B.

According to an embodiment, the first light emitting pattern layers EP1 may be deposited after being patterned in the unit of pixel by the tip portion defined in the bank PW. For example, the first light emitting pattern layers EP1 may be commonly formed by using an open mask but may be readily divided into plural portions in the unit of pixel by the bank PW.

In a case where the first light emitting pattern layers EP1 are patterned by using a fine metal mask (FMM), a support spacer protruding from the bank is required to support the fine metal mask. For example, since the fine metal mask is spaced apart from a base surface on which a patterning process is performed by a height of the bank and the support spacer, there may be limitations to implementing a high resolution of the display device. For example, as the fine metal mask is in contact with the support spacer, foreign substances may remain on the support spacer, or the support spacer may be damaged by getting scratches due to the fine metal mask after the patterning process of the first light emitting pattern layers EP1. Accordingly, defects may occur in the display panel.

According to an embodiment, as the display panel DP includes the bank PW, the light emitting elements ED1, ED2, and ED3 may be separated (e.g., physically and readily separated) from each other. Accordingly, a leakage current or a driving error between the light emitting areas PXA-R, PXA-G, and PXA-B adjacent to each other may be prevented or minimized, and each of the light emitting elements ED1, ED2, and ED3 may be driven independently.

For example, since the first light emitting pattern layers EP1 are patterned without masks that are in contact with elements in the display area DA (refer to FIG. 2), a defective rate of the display panel DP may be reduced, and a process reliability of the display panel DP may be improved. As the first light emitting pattern layers EP1 are patterned without the support spacer protruding from the bank PW, the size of the light emitting areas PXA-R, PXA-G, and PXA-B may be reduced, and the high resolution of the display panel DP may be implemented.

For example, in case of manufacturing a large-sized display panel DP, a process cost may be reduced by omitting a production of a large-sized mask, and the display panel DP may be provided with improved process reliability because the display panel DP is not affected by defects that occur in the large-sized mask.

In an embodiment, capping pattern layers CP1, CP2, and CP3 may include a first capping pattern layer CP1, a second capping pattern layer CP2, and a third capping pattern layer CP3. The first, second, and third capping pattern layers CP1, CP2, and CP3 may be disposed on the first, second, and third cathodes CE1, CE2, and CE3, respectively, and may be disposed in the first, second, and third bank openings OP1-P, OP2-P, and OP3-P, respectively.

In an embodiment, the dummy pattern layers DMP may include first dummy pattern layers D1, second dummy pattern layers D2, and third dummy pattern layers D3.

The first dummy pattern layers D1 may include first-first, first-second, and first-third dummy pattern layers D11, D12, and D13 that respectively surround the first, second, and third light emitting areas PXA-R, PXA-G, and PXA-B in a plan view. The first-first, first-second, and first-third dummy pattern layers D11, D12, and D13 may include the same material as the first, second, and third light emitting pattern layers EP1, EP2, and EP3, respectively, and may be formed by the same process as the first, second, and third light emitting pattern layers EP1. EP2, and EP3.

The second dummy pattern layers D2 may include second-first, second-second, and second-third dummy pattern layers D21, D22, and D23 that respectively surround the first, second, and third light emitting areas PXA-R, PXA-G, and PXA-B in a plan view. The second-first, second-second, and second-third dummy pattern layers D21, D22, and D23 may include the same material as the first, second, and third cathodes CE1, CE2, and CE3, respectively, and may be formed by the same process as the first, second, and third cathodes CE1, CE2, and CE3.

The third dummy pattern layers D3 may include third-first, third-second, and third-third dummy pattern layers D31, D32, and D33 that respectively surround the first, second, and third light emitting areas PXA-R, PXA-G, and PXA-B in a plan view. The third-first, third-second, and third-third dummy pattern layers D31, D32, and D33 may include the same material as the first, second, and third capping pattern layers CP1, CP2, and CP3, respectively, and may be formed by the same process as the first, second, and third capping pattern layers CP1, CP2, and CP3.

First, second, and third dummy openings OP1-D, OP2-D, and OP3-D respectively corresponding to (or overlapping) the first, second, and third light emitting openings OP1-E, OP2-E, and OP3-E may be defined (or formed) by the dummy pattern layers DMP. Each of the first, second, and third dummy openings OP1-D, OP2-D, and OP3-D may include first, second, and third areas AA1, AA2, and AA3 (refer to FIG. 9I) sequentially arranged in the third direction DR3. The first dummy opening OP1-D may be defined by inner side surfaces of the first-first, second-first, and third-first dummy pattern layers D11, D21, and D31, the second dummy opening OP2-D may be defined by inner side surfaces of the first-second, second-second, and third-second dummy pattern layers D12, D22, and D32, and the third dummy opening OP3-D may be defined by inner side surfaces of the first-third, second-third, and third-third dummy pattern layers D13, D23, and D33.

The thin film encapsulation layer TFE may include lower encapsulation inorganic pattern layers LIL1, LIL2, and LIL3, the encapsulation organic layer OL, and the upper encapsulation inorganic layer UIL. In an embodiment, the lower encapsulation inorganic pattern layers LIL1, LIL2, and LIL3 may include a first lower encapsulation inorganic pattern layer LIL1, a second lower encapsulation inorganic pattern layer LIL2, and a third lower encapsulation inorganic pattern layer LIL3. The first, second, and third lower encapsulation inorganic pattern layers LIL1, LIL2, and LIL3 may be disposed to correspond to (or to overlap) the first, second, and third light emitting openings OP1-E, OP2-E, and OP3-E, respectively.

The first lower encapsulation inorganic pattern layer LIL1 may cover the first light emitting element ED1 and the first-first, second-first, and third-first dummy pattern layers D11, D21, and D31, and a portion of the first lower encapsulation inorganic pattern layer LIL1 may be disposed in the first bank opening OP1-P. The second lower encapsulation inorganic pattern layer LIL2 may cover the second light emitting element ED2 and the first-second, second-second, and third-second dummy pattern layers D12, D22, and D32, and a portion of the second lower encapsulation inorganic pattern layer LIL2 may be disposed in the second bank opening OP2-P. The third lower encapsulation inorganic pattern layer LIL3 may cover the third light emitting element ED3 and the first-third, second-third, and third-third dummy pattern layers D13, D23, and D33, and a portion of the third lower encapsulation inorganic pattern layer LIL3 may be disposed in the third bank opening OP3-P. The first, second, and third lower encapsulation inorganic pattern layers LIL1, LIL2, and LIL3 may be arranged spaced apart from each other in a pattern shape. According to an embodiment, as the light emitting pattern layers EP1, EP2, and EP3 are provided separately for each pixel and the lower encapsulation inorganic pattern layers LIL1, LIL2, and LIL3 are provided for each pixel in the pattern shape, a moisture path between adjacent pixels may be prevented from being formed, and thus, the pixels may be prevented from being damaged.

Figure 7:
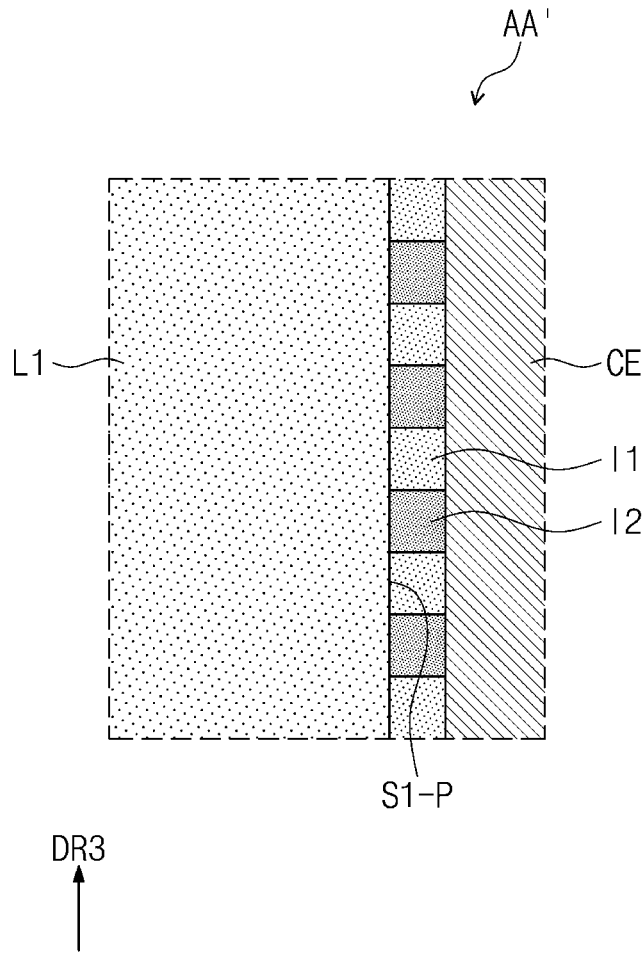
FIG. 7 is an enlarged schematic cross-sectional view of an area AA' of FIG. 5 of a display panel according to an embodiment.

FIG. 7 is an enlarged schematic cross-sectional view of an area AA' of FIG. 5 of the display panel according to an embodiment. FIG. 7 is an enlarged schematic view of the first layer L1 of the bank PW (refer to FIG. 5) and the cathode CE that is in contact with the first layer L1.

Referring to FIG. 7, a first interface layer I1 and a second interface layer I2 may be formed on the first inner side surface S1-P of the first layer L1. In an embodiment, the first layer L1 may include the AlNiLa alloy, the first interface layer I1 may include aluminum oxide ($AlO_x$) formed by an oxidation reaction on the first inner side surface S1-P, and the second interface layer I2 may include the $Al_xNi$ phase.

According to an embodiment, the first layer L1 may be formed by a deposition process under high temperature conditions at a temperature equal to or greater than about 200 degrees Celsius and equal to or smaller than about 250 degrees Celsius. For example, the second layer L2 may also be formed by a deposition process under high temperature conditions at a temperature equal to or greater than about 200 degrees Celsius and equal to or smaller than about 250 degrees Celsius, and the first layer L1 may be exposed to the high temperature conditions during the deposition process of the second layer L2 (refer to FIG. 5). Accordingly, the $Al_xNi$ phase may be formed on the first layer L1 by a high temperature treatment, and thus, the second interface layer I2 may be formed on the first inner side surface S1-P.

In the case of the comparative example in which the first layer L1 includes the single metal material of aluminum (Al), only the first interface layer I1 may be formed (e.g., entirely formed) on the first inner side surface S1-P. For example, the cathode CE may be in contact with the first interface layer I1 including the metal oxide, and the contact resistance between the cathode CE and the first layer L1 may increase.

As described in an embodiment, in the case where the first layer L1 includes the aluminum-based alloy, e.g., the AlNiLa alloy, not only the first interface layer I1 but also the second interface layer I2 may be formed on the first inner side surface S1-P. Accordingly, an area of the first interface layer I1 on the first inner side surface S1-P may be reduced, an area where the cathode CE is in contact with the first interface layer I1 may be reduced, and the cathode CE may be in contact with the second interface layer 12 including the metal material. Thus, the contact resistance between the cathode CE and the first layer L1 may be reduced, the display efficiency and the electrical reliability of the light emitting element ED (refer to FIG. 5) may be improved.

In the case where the first layer L1 includes the single metal material of aluminum (Al) as described in the comparative example, the contact resistance between the first layer L1 and indium tin oxide (ITO) may be about 10,000Ω. According to an embodiment, in the case where the first layer L1 includes the AlNiLa alloy and is subjected to the high temperature treatment, the contact resistance between the first layer L1 and indium tin oxide (ITO) may be equal to or greater than about 100 Ω and equal to or smaller than about 1,000Ω. For example, according to an embodiment, the contact resistance between the first layer L1 and indium tin oxide (ITO) may be reduced to from about 0.01 times to about 0.1 times compared to the comparative example. Accordingly, the contact resistance of the first layer L1 and the cathode CE including the conductive material may be reduced compared to the comparative embodiment.

Figure 8:
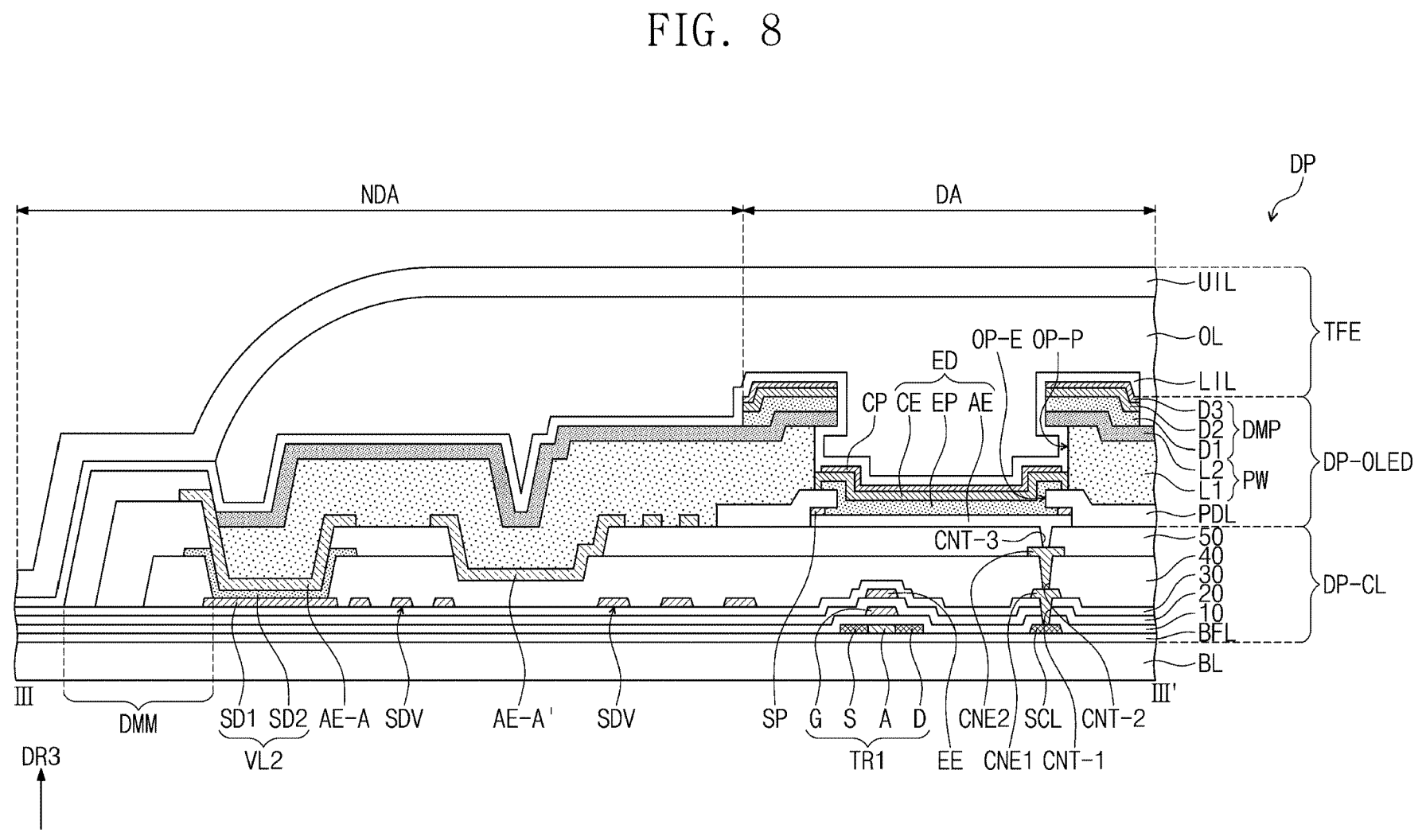

FIG. 8 is a schematic cross-sectional view of the display panel DP taken along line III-III' of FIG. 3A according to an embodiment. FIG. 8 is an enlarged schematic cross-sectional view of the non-display area NDA and the display area DA adjacent to the non-display area NDA of the display panel DP. In FIG. 8, the same/similar reference numerals denote the same/similar elements in FIGS. 1A to 7, and thus, detailed descriptions of the same/similar elements will be omitted for descriptive convenience.

Referring to FIG. 8, the second driving voltage line VL2 may be disposed in the non-display area NDA. In an embodiment, the second driving voltage line VL2 may include a plurality of layers. As an example, the second driving voltage line VL2 may include a first electrode layer SD1 and a second electrode layer SD2.

The first electrode layer SD1 may be disposed on the third insulating layer 30. The first electrode layer SD1 and the first connection electrode CNE1 may be formed by the same process, may include the same material, and may have the same structure. At least a portion of the first electrode layer SD1 may be exposed without being covered by the fourth insulating layer 40, the fifth insulating layer 50, and the pixel definition layer PDL.

The second electrode layer SD2 may cover an end portion of the fourth insulating layer 40 and may be disposed on the first electrode layer SD1 exposed without being covered by the fourth insulating layer 40. For example, the second electrode layer SD2 may be in contact with an upper surface of the first electrode layer SD1 and may be connected (e.g., electrically connected) to the first electrode layer SD1. The second electrode layer SD2 and the second connection electrode CNE2 may be formed by the same process, may include the same material, and may have the same structure.

However, embodiments are not limited thereto or thereby. According to an embodiment, the second driving voltage line VL2 may include only one of the first electrode layer SD1 and the second electrode layer SD2.

An auxiliary electrode AE-A may be disposed on the second driving voltage line VL2. For example, the auxiliary electrode AE-A may cover an end portion of the fifth insulating layer 50 and may be disposed on the second electrode layer SD2. For example, the auxiliary electrode AE-A may be in contact with an upper surface of the second electrode layer SD2 and may be electrically connected to the second driving voltage line VL2. The auxiliary electrode AE-A and the anode AE may be formed by the same process, may include the same material, and may have the same structure. According to an embodiment, the auxiliary electrode AE-A may include ITO/Ag/ITO.

The bank PW may also overlap the non-display area NDA. The bank PW may extend from the display area DA to the second driving voltage line VL2 disposed in the non-display area NDA. The bank PW may be in contact with (e.g., in direct contact with) the auxiliary electrode AE-A disposed on the second driving voltage line VL2. Accordingly, the bank PW may receive the second driving voltage ELVSS (refer to FIG. 3B) from the second driving voltage line VL2 via the auxiliary electrode AE-A, and the cathode CE that is in contact with the bank PW in the display area DA may receive the second driving voltage ELVSS (refer to FIG. 3B) via the bank PW. According to an embodiment, as the second driving voltage ELVSS (refer to FIG. 3B) is applied to the cathode CE through the bank PW having a relatively large thickness, a voltage drop phenomenon may be reduced.

According to an embodiment, as the first layer L1 includes the AlLiNa alloy, the first layer L1 may have a relatively high reduction potential, and thus, a difference in electric potential between the first layer L1 and the auxiliary electrode AE-A may be reduced. Accordingly, a corrosion reaction in a portion of the first layer L1 that is in contact with the auxiliary electrode AE-A, for example, galvanic corrosion, may be reduced. The first layer L1 may be prevented from being damaged due to the corrosion reaction, and defects of the bank PW may be prevented. For example, the electrical reliability between the bank PW and the auxiliary electrode AE-A may be improved, and the driving voltage may be stably provided to the cathode CE.

The scan driver SDV may include thin film transistors formed by the same process as the conductive pattern layers of the pixel circuit PDC (refer to FIG. 3B). FIG. 8 shows a structure in which the thin film transistors of the scan driver SDV are disposed on the third insulating layer 30.

A dam DMM may be disposed in the non-display area NDA. The dam DMM may include insulating layers. As an example, the dam DMM may include a first layer formed by the same process as the fourth insulating layer 40, a second layer formed by the same process as the fifth insulating layer 50, and a third layer formed by the same process as the pixel definition layer PDL, however, embodiments are not limited thereto or thereby. Different from the display panel DP shown in FIG. 8, the dam DMM may have a single-layer structure, a two-layer structure, or four or more layer structure.

The lower encapsulation inorganic pattern layer LIL, the encapsulation organic layer OL, and the upper encapsulation inorganic layer UIL may be disposed in the non-display area NDA. The encapsulation organic layer OL may extend from the display area DA to an area where the dam DMM is disposed. The dam DMM may control a flow of monomer in case that the encapsulation organic layer OL is formed. The lower encapsulation inorganic pattern layer LIL and the upper encapsulation inorganic layer UIL may extend from the display area DA to the area where the dam DMM is disposed to cover the dam DMM and may be in contact with each other on the dam DMM to encapsulate the encapsulation organic layer OL.

The display panel DP may further include an additional auxiliary electrode AE-A'. The additional auxiliary electrode AE-A' may be in contact with the first layer L1 of the bank PW. Accordingly, the area where the first layer L1 is in contact with the electrode providing the driving voltage may increase, and the contact resistance of the first layer L1 may be reduced. The additional auxiliary electrode AE-A' and the anode AE may be formed by the same process, may include the same material, and may have the same structure. According to an embodiment, the additional auxiliary electrode AE-A' may be omitted.

FIGS. 9A to 9L are schematic cross-sectional views of a method of manufacturing the display panel according to an embodiment. In FIGS. 9A to 9L, the same/similar reference numerals denote the same/similar elements in FIGS. 1A to 8, and thus, detailed descriptions of the same/similar elements will be omitted for descriptive convenience.

The manufacturing method of the display panel may include providing a preliminary display panel including the base layer, the anode disposed on the base layer, and a preliminary pixel definition layer disposed on the base layer and covering the anode, forming the first layer including the AlNiLa alloy on the preliminary pixel definition layer, forming the second layer including the MoTa alloy oxide on the first layer, patterning the first and second layers to form the bank through which the bank opening is opened, forming the light emitting pattern layer in the bank opening, and forming the cathode in the bank opening to be in contact with the bank.

Hereinafter, a method of forming the light emitting element ED and the lower encapsulation inorganic pattern layer LIL covering the light emitting element ED will be described with reference to FIGS. 9A to 9L.

Figure 9A:
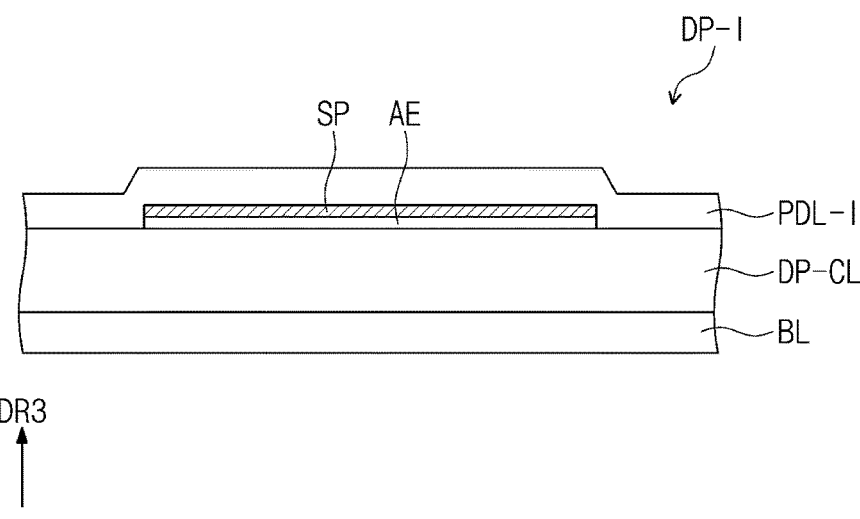
FIGS. 9A to 9L are schematic cross-sectional views of a method of manufacturing a display panel according to an embodiment.

Referring to FIG. 9A, the manufacturing method of the display panel may include the providing of the preliminary display panel DP-I. The preliminary display panel DP-I may include the base layer BL, the circuit element layer DP-CL, the anode AE, the sacrificial pattern layer SP, and the preliminary pixel definition layer PDL-I.

The circuit element layer DP-CL may be formed by a conventional circuit element manufacturing method that forms an insulating layer, a semiconductor layer, and a conductive layer by a coating process or a depositing process and patterns the insulating layer, the semiconductor layer, and the conductive layer by a photolithography process and an etching process to form the semiconductor pattern layer, the conductive pattern layer, and the signal line.

The anode AE and the sacrificial pattern layer SP may be formed by the same patterning process. The preliminary pixel definition layer PDL-I may cover the anode AE and the sacrificial pattern layer SP.

Figure 9B:
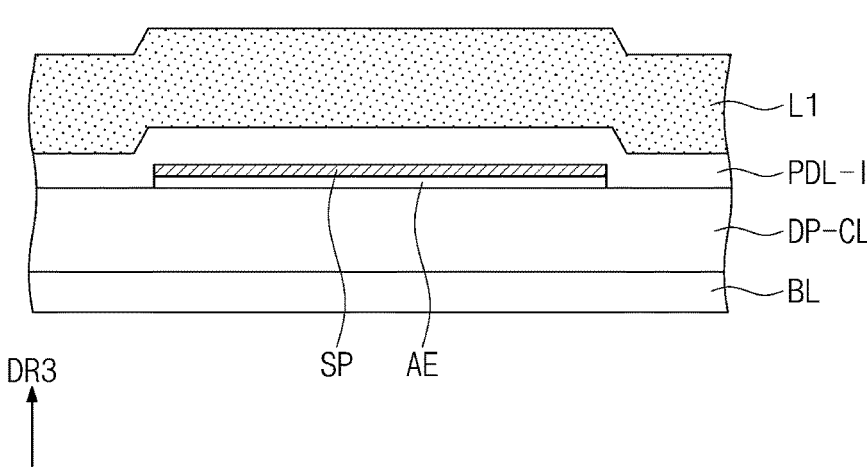

Referring to FIG. 9B, the manufacturing method of the display panel may include the forming of the first layer L1 including a first conductive material on the preliminary pixel definition layer PDL-I.

The forming of the first layer L1 may include a deposition process of the first conductive material. In an embodiment, the first conductive material may include the AlNiLa alloy. As an example, the forming of the first layer L1 may be performed by a sputtering deposition process. The sputtering deposition process of the first conductive material may be carried out (or performed) under an argon (Ar) gas condition.

In an embodiment, the deposition process of the first conductive material may be carried out (or performed) under a high temperature condition. As the first conductive material is heat-treated at the high temperature, the $Al_xNi$ phase may be formed in the first layer L1.

The deposition process of the first conductive material may be performed at a temperature equal to or greater than about 200° C. and equal to or smaller than about 250° C. In case that the deposition process of the first conductive material is performed at a temperature lower than about 200° C., the $Al_xNi$ phase may not be formed in the first layer L1, and in case that the deposition process of the first conductive material is performed at a temperature higher than about 250° C., the insulating layer included in the preliminary display panel DP-I (refer to FIG. 9A) may be partially damaged.

Figure 9C:
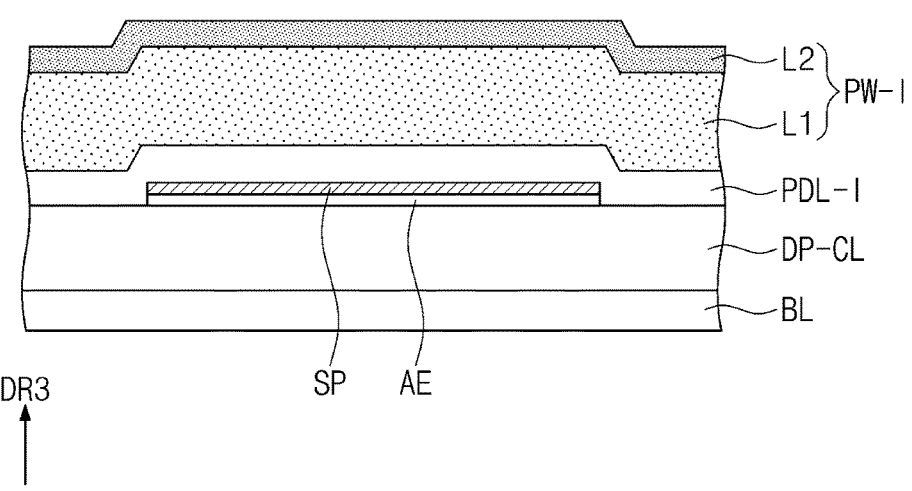

Referring to FIG. 9C, the manufacturing method of the display panel may include the forming of the second layer L2 including a second conductive material on the first layer L1 to form a preliminary bank PW-I. The preliminary bank PW-I may include the first layer L1 and the second layer L2.

The forming of the second layer L2 may include a deposition process of the second conductive material. In an embodiment, the second conductive material may include the MoTa alloy oxide. As an example, the forming of the second layer L2 may be performed by a sputtering deposition process.

In an embodiment, the deposition process of the second conductive material may be performed at a high temperature condition. Accordingly, the first layer L1 including the first conductive material may also be heat-treated at the high temperature, and thus, the $Al_xNi$ phase may be further formed in the first layer L1.

The deposition process of the second conductive material may be performed at a temperature equal to or greater than about 200° C. and equal to or smaller than about 250° C. In case that the deposition process of the second conductive material is performed at a temperature lower than about 200° C., the Al$_x$Ni phase may not be formed in the first layer L1, and in case that the deposition process of the second conductive material is performed at a temperature higher than about 250° C., the insulating layer included in the preliminary display panel DP-I (refer to FIG. 9A) may be partially damaged.

According to an embodiment, in case that the Al$_x$Ni phase is sufficiently formed in the first layer L1 during the deposition process of the first conductive material, the deposition process of the second conductive material may be performed at a room temperature condition.

Figure 9D:
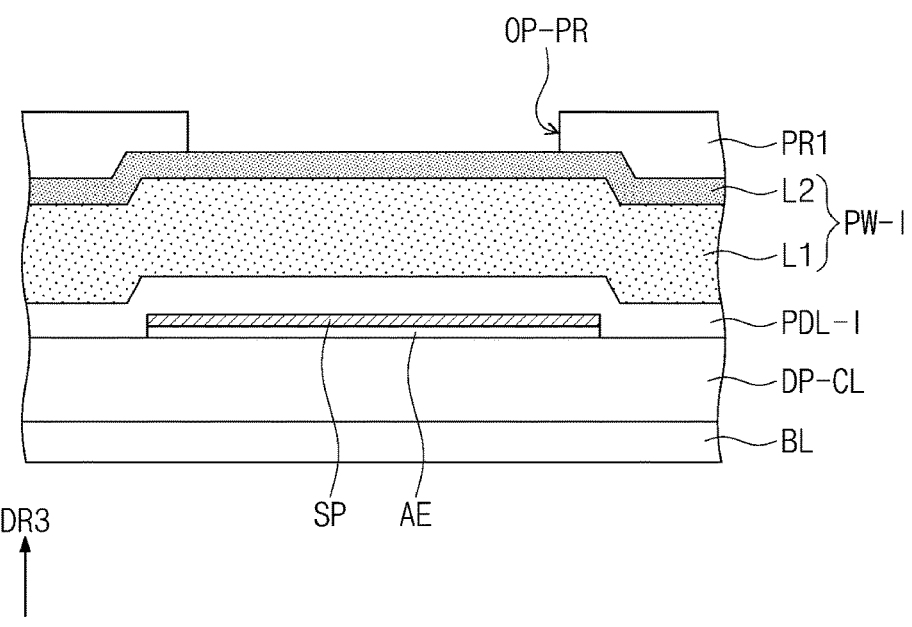

Referring to FIG. 9D, the manufacturing method of the display panel may include forming a first photoresist layer PR1 on the preliminary bank PW-I. The first photoresist layer PR1 may be formed by forming a preliminary photoresist layer on the preliminary bank PW-I and patterning the preliminary photoresist layer using a photomask. A photo opening OP-PR corresponding to (or overlapping) the anode AE may be formed by the first photoresist layer PR1 by the patterning process.

Figure 9E:
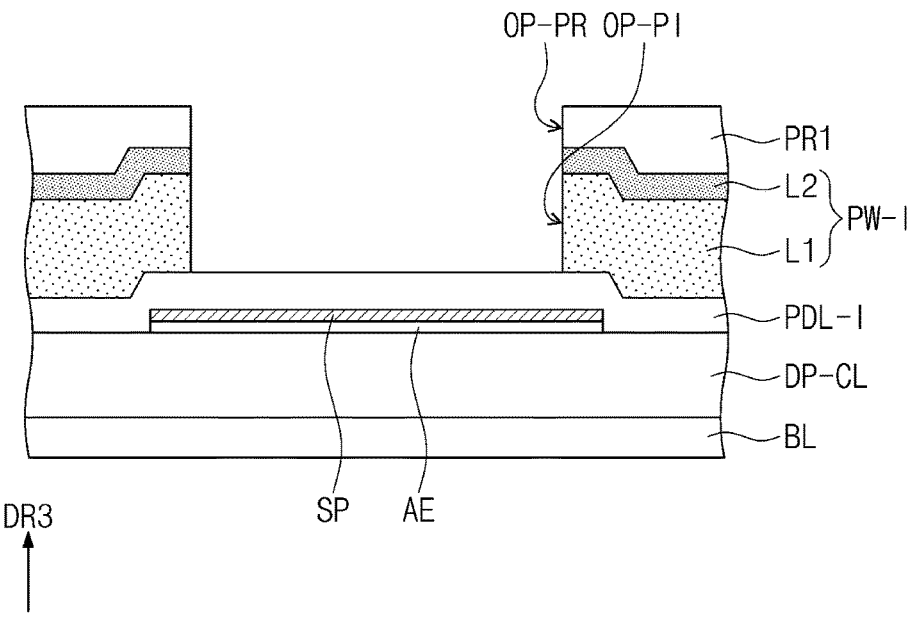
Figure 9F:
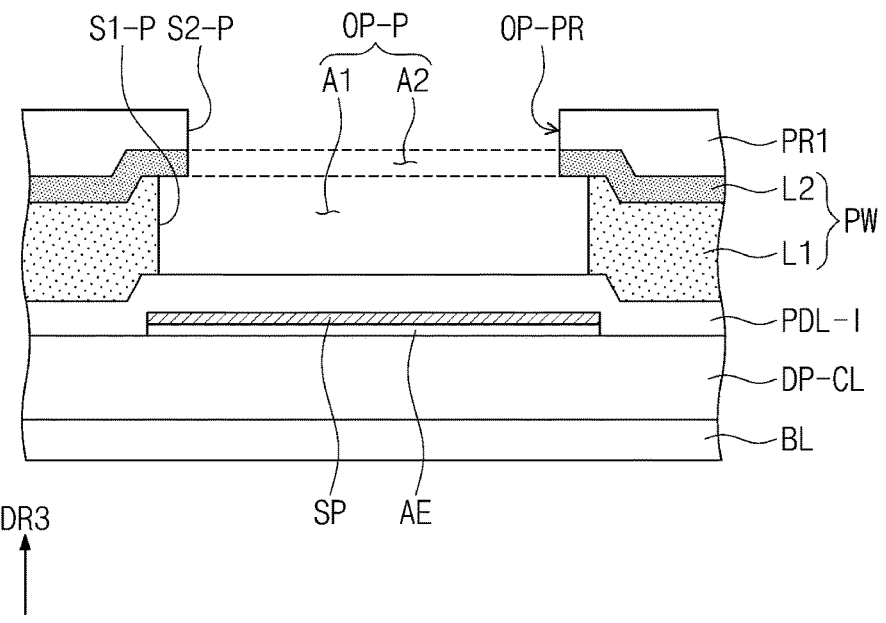

Referring to FIGS. 9E and 9F, the manufacturing method of the display panel may include the patterning of the first and second layers L1 and L2 to form the bank PW from the preliminary bank PW-I.

As shown in FIG. 9E, the patterning of the first and second layers L1 and L2 may include dry-etching the first and second layers L1 and L2 by using the first photoresist layer PR1 as a mask to form a preliminary bank opening OP-PI by the preliminary bank PW-I.

In an embodiment, the dry etching process may be performed in an etching environment where an etch selectivity of the first layer L1 is substantially the same as an etch selectivity of the second layer L2. Accordingly, an inner side surface of the first layer L1 and an inner side surface of the second layer L2, which define the preliminary bank opening OP-PI, may be aligned with each other.

As shown in FIG. 9F, the patterning of the first and second layers L1 and L2 may include wet-etching the first and second layers L1 and L2 using the first photoresist layer PR1 as a mask to form the bank opening OP-P from the preliminary bank opening OP-PI.

The bank opening OP-P may include the first area A1 and the second area A2, which are sequentially arranged in a thickness direction, e.g., the third direction DR3. The first layer L1 may include the first inner side surface S1-P that defines the first area A1 of the bank opening OP-P. and the second layer L2 may include the second inner side surface S2-P that defines the second area A2 of the bank opening OP-P.

In an embodiment, the wet etching process may be performed in an etching environment where the first layer L1 has a difference in etch selectivity with respect to the second layer L2. Accordingly, the inner side surface of the bank PW, which defines (or forms) the bank opening OP-P, may have an undercut shape in the cross-section. As an etch rate of the first layer L1 for an etch solution is greater than an etch rate of the second layer L2 for the etch solution, the first layer L1 may be etched. Therefore, the first inner side surface S1-P of the first layer L1 may be formed to be recessed further inwardly than the second inner side surface S2-P of the second layer L2. The tip portion may be formed in the bank PW by the portion of the second layer L2, which protrudes from the first layer L1.

Figure 9G:
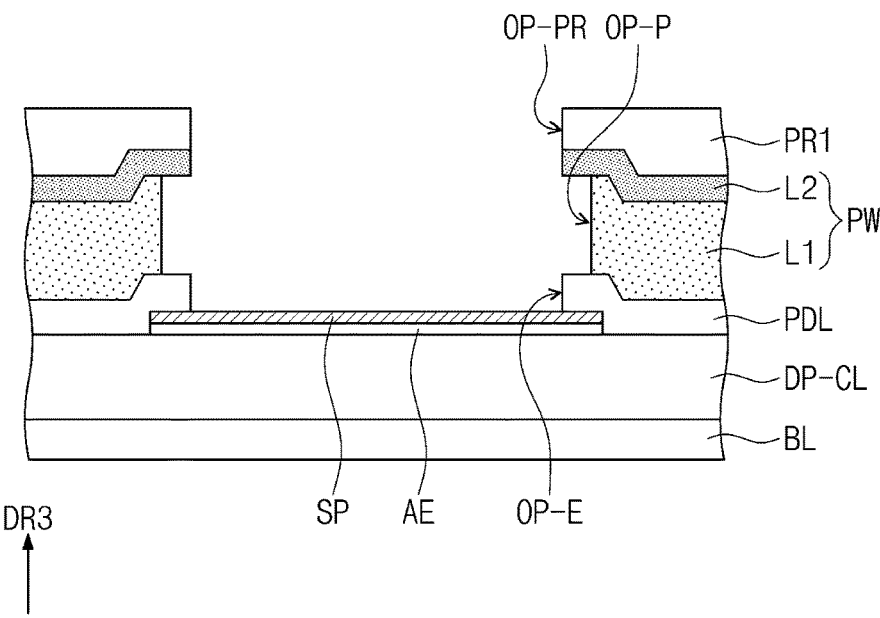

Referring to FIGS. 9F and 9G, the manufacturing method of the display panel may include the etching of the preliminary pixel definition layer PDL-I to form the pixel definition layer PDL. The etching of the preliminary pixel definition layer PDL-I may be performed by the dry etching process by using the first photoresist layer PR1 and the bank PW, e.g., the second layer L2, as a mask. The light emitting opening OP-E may be formed by the pixel definition layer PDL to correspond to (or to overlap) the bank opening OP-P.

Figure 9H:
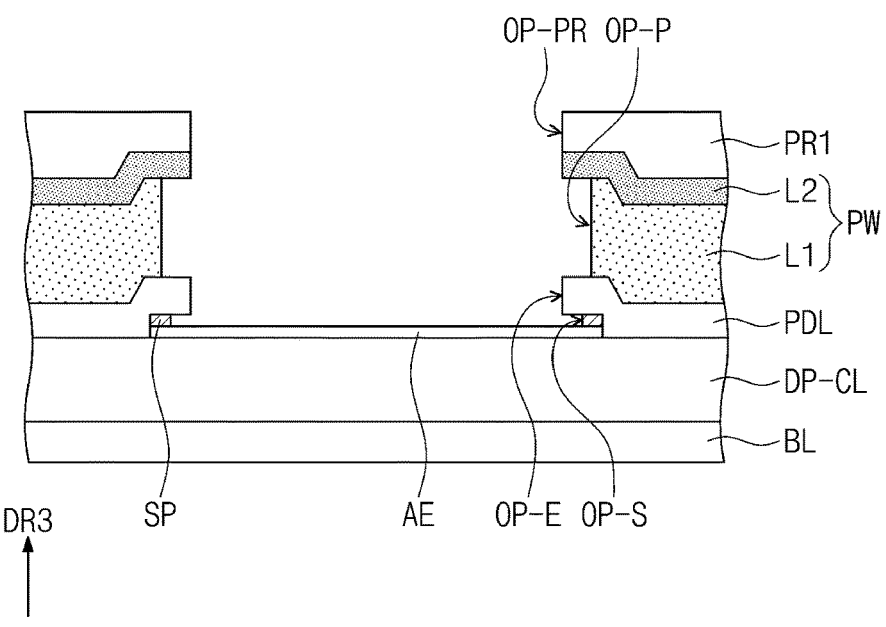

Referring to FIG. 9H, the manufacturing method of the display panel may include the etching of the sacrificial pattern layer SP. The etching of the sacrificial pattern layer SP may be performed by the wet etching method using the first photoresist layer PR1 and the bank PW, e.g., the second layer L2, as a mask.

The sacrificial opening OP-S may be formed by the sacrificial pattern layer SP to correspond to (or to overlap) the light emitting opening OP-E. At least the portion of the anode AE may be exposed through the sacrificial opening OP-S and the light emitting opening OP-E without being covered by the sacrificial pattern layer SP and the pixel definition layer PDL.

The etching process of the sacrificial pattern layer SP may be performed in an etching environment where the sacrificial pattern layer SP has a difference in etch selectivity with respect to the anode AE, and thus, the anode AE may be prevented from being etched together with the sacrificial pattern layer SP. For example, it is possible to prevent the anode AE from being etched and damaged during the etching process by placing the sacrificial pattern layer SP with a higher etch rate than the anode AE between the pixel definition layer PDL and the anode AE.

Figure 9I:
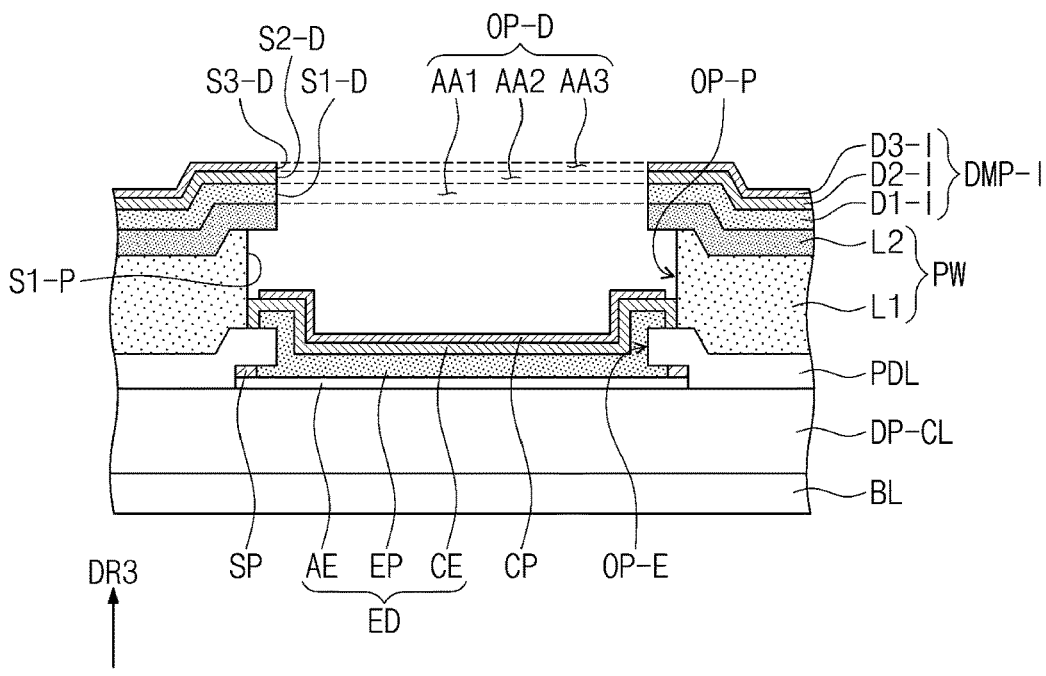

Referring to FIG. 9I, the manufacturing method of the display panel may include forming the light emitting pattern layer EP, forming the cathode CE, and forming the capping pattern layer CP after removing the first photoresist layer PR1 (refer to FIG. 9H).

Each of the forming of the light emitting pattern layer EP, the forming of the cathode CE, and the forming of the capping pattern layer CP may be performed by a deposition process. The forming of the light emitting pattern layer EP may be performed by a thermal evaporation process, the forming of the cathode CE may be performed by a sputtering process, and the forming of the capping pattern layer CP may be performed by a thermal evaporation process, however, embodiments are not limited thereto or thereby.

In the forming of the light emitting pattern layer EP, the light emitting pattern layer EP may be separated by the tip portion formed in the bank PW and may be disposed in the light emitting opening OP-E and the bank opening OP-P. In the forming of the light emitting pattern layer EP, a first preliminary dummy pattern layer D1-I may be formed on the bank PW to be spaced apart from the light emitting pattern layer EP.

In the forming of the cathode CE, the cathode CE may be separated by the tip portion formed in the bank PW and may be disposed in the bank opening OP-P. The cathode CE may be provided with a high angle of incidence relative to the light emitting pattern layer EP and the cathode CE may be formed to contact the first inner side surface S1-P of the first layer L1. In the forming of the cathode CE, a second preliminary dummy pattern layer D2-I may be formed on the bank PW to be spaced apart from the cathode CE. The anode AE, the light emitting pattern layer EP, and the cathode CE may form the light emitting element ED.

In the forming of the capping pattern layer CP, the capping pattern layer CP may be separated by the tip portion formed in the bank PW and may be disposed in the bank opening OP-P. In the forming of the capping pattern layer CP, a third preliminary dummy pattern layer D3-I may be formed on the bank PW to be spaced apart from the capping pattern layer CP. According to an embodiment, the forming of the capping pattern layer CP may be omitted.

The first, second, and third preliminary dummy pattern layers D1-I, D2-I, and D3-I may form a preliminary dummy pattern layer DMP-I, and the preliminary dummy pattern layer DMP-I may be provided with a dummy opening OP-D defined (or formed) therethrough. The dummy opening OP-D may include the first area AA1, the second area AA2, and the third area AA3 sequentially arranged in the thickness direction, e.g., the third direction DR3. The first preliminary dummy pattern layer D1-I may include the first inner side surface S1-D that defines the first area AA1 of the dummy opening OP-D, the second preliminary dummy pattern layer D2-I may include the second inner side surface S2-D that defines the second area AA2 of the dummy opening OP-D, and the third preliminary dummy pattern layer D3-I may include the third inner side surface S3-D that defines the third area AA3 of the dummy opening OP-D.

Figure 9J:
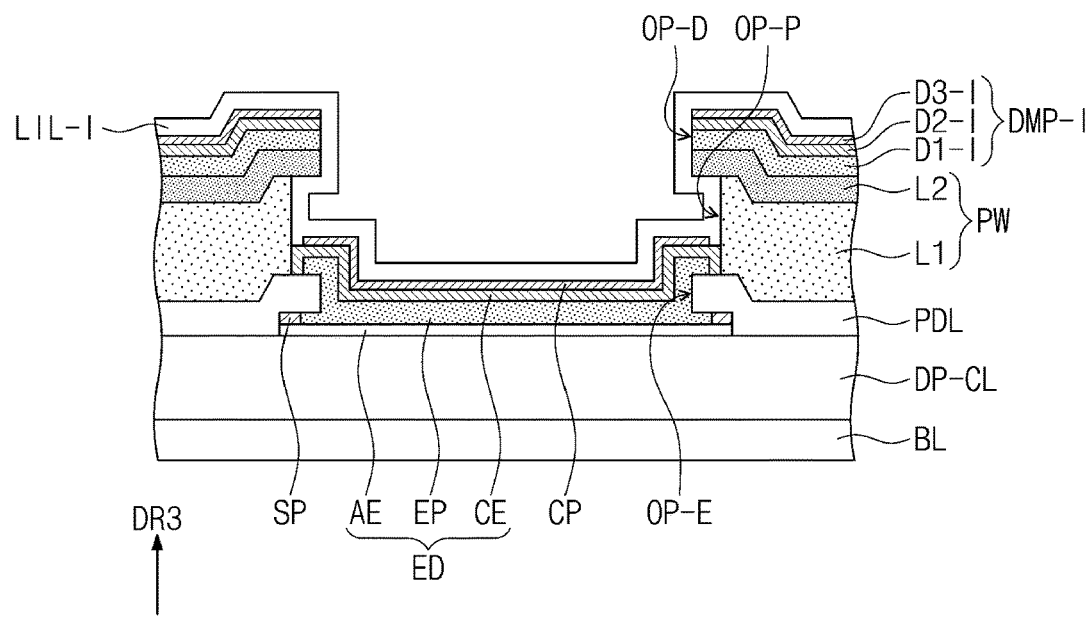

Referring to FIG. 9J, the manufacturing method of the display panel may include forming a preliminary lower encapsulation inorganic pattern layer LIL-I.

The preliminary lower encapsulation inorganic pattern layer LIL-I may be formed by a deposition process. For example, the preliminary lower encapsulation inorganic pattern layer LIL-I may be formed by a chemical vapor deposition (CVD) process. The preliminary lower encapsulation inorganic pattern layer LIL-I may be formed on the bank PW and the cathode CE, and a portion of the preliminary lower encapsulation inorganic pattern layer LIL-I may be formed inside the bank opening OP-P.

Figure 9K:
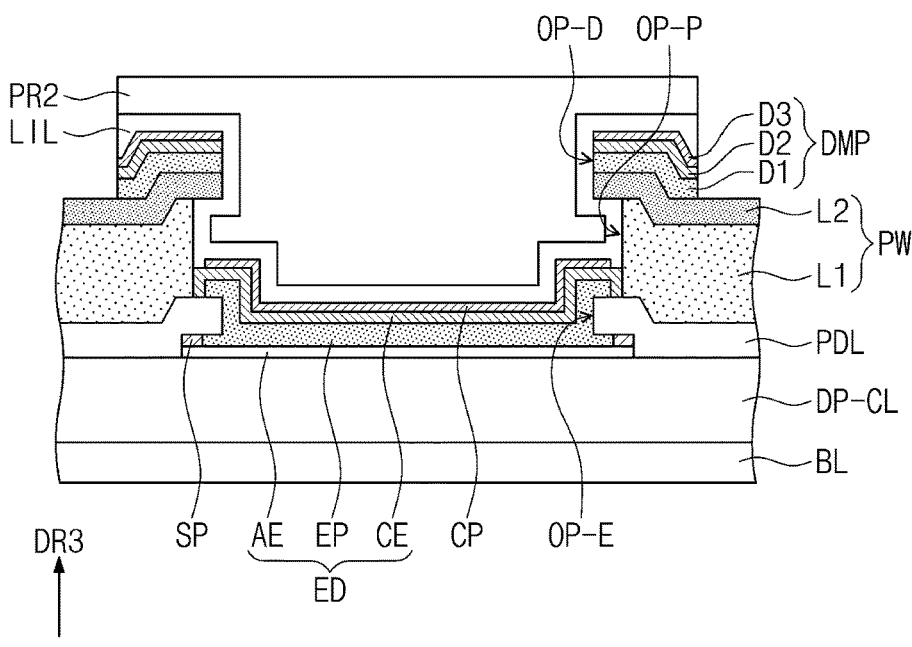

Referring to FIGS. 9J and 9K, the manufacturing method of the display panel may include forming a second photoresist layer PR2, patterning the preliminary lower encapsulation inorganic pattern layer LIL-I to form the lower encapsulation inorganic pattern layer LIL, and patterning the preliminary dummy pattern layers DMP-I to form the dummy pattern layers DMP.

In the forming of the second photoresist layer PR2, the second photoresist layer PR2 may be formed by forming a preliminary photoresist layer and patterning the preliminary photoresist layer using a photomask. The second photoresist layer PR2 may be formed in a pattern disposed to correspond to (or to overlap) the light emitting opening OP-E by the patterning process.

According to the patterning of the preliminary lower encapsulation inorganic pattern layer LIL-I, the preliminary lower encapsulation inorganic pattern layer LIL-I may be dry-etched, and thus, portions of the preliminary lower encapsulation inorganic pattern layer LIL-I, which overlaps the other anodes, may be removed except a portion of the preliminary lower encapsulation inorganic pattern layer LIL-I, which is disposed to correspond to (or to overlap) a corresponding anode AE. As an example, in case that the preliminary lower encapsulation inorganic pattern layer LIL-I corresponds to the first anode AE1 (refer to FIG. 6), the portions of the preliminary lower encapsulation inorganic pattern layer LIL-I, which are disposed to correspond to (or to overlap) the second and third anodes AE2 and AE3 (refer to FIG. 6), may be removed.

The lower encapsulation inorganic pattern layer LIL overlapping the corresponding light emitting opening OP-E may be formed from the patterned preliminary lower encapsulation inorganic pattern layer LIL-I. A portion of the lower encapsulation inorganic pattern layer LIL may be disposed in the bank opening OP-P to cover the light emitting element ED, and another portion of the lower encapsulation inorganic pattern layer LIL may be disposed on the bank PW.

According to the patterning of the preliminary dummy pattern layers DMP-I, the first, second, and third preliminary dummy pattern layers D1-I, D2-I, and D3-I may be dry-etched, and thus, portions of the first, second, and third preliminary dummy pattern layers D1-I, D2-I, and D3-I, which are disposed to correspond to (or to overlap) the other anodes, may be removed except a portion of the first, second, and third preliminary dummy pattern layers D1-I, D2-I, and D3-I, which is disposed to correspond to (or to overlap) a corresponding anode AE. As an example, in case that the first, second, and third preliminary dummy pattern layers D1-I, D2-I, and D3-I correspond to the first anode AE1 (refer to FIG. 6), the portions of the first, second, and third preliminary dummy pattern layers D1-I. D2-I, and D3-I, which overlap the second and third anodes AE2 and AE3 (refer to FIG. 6), may be removed.

The first, second, and third dummy pattern layers D1, D2, and D3, which overlap the corresponding light emitting opening OP-E, may be formed from the patterned first, second, and third preliminary dummy pattern layers D1-I, D2-I, and D3-I, and thus, the dummy pattern layers DMP including the first, second, and third dummy pattern layers D1, D2, and D3 may be formed. The first, second, and third dummy pattern layers D1, D2, and D3 may have a closed-line shape surrounding the corresponding light emitting area PXA (refer to FIG. 5) in a plan view.

Figure 9L:
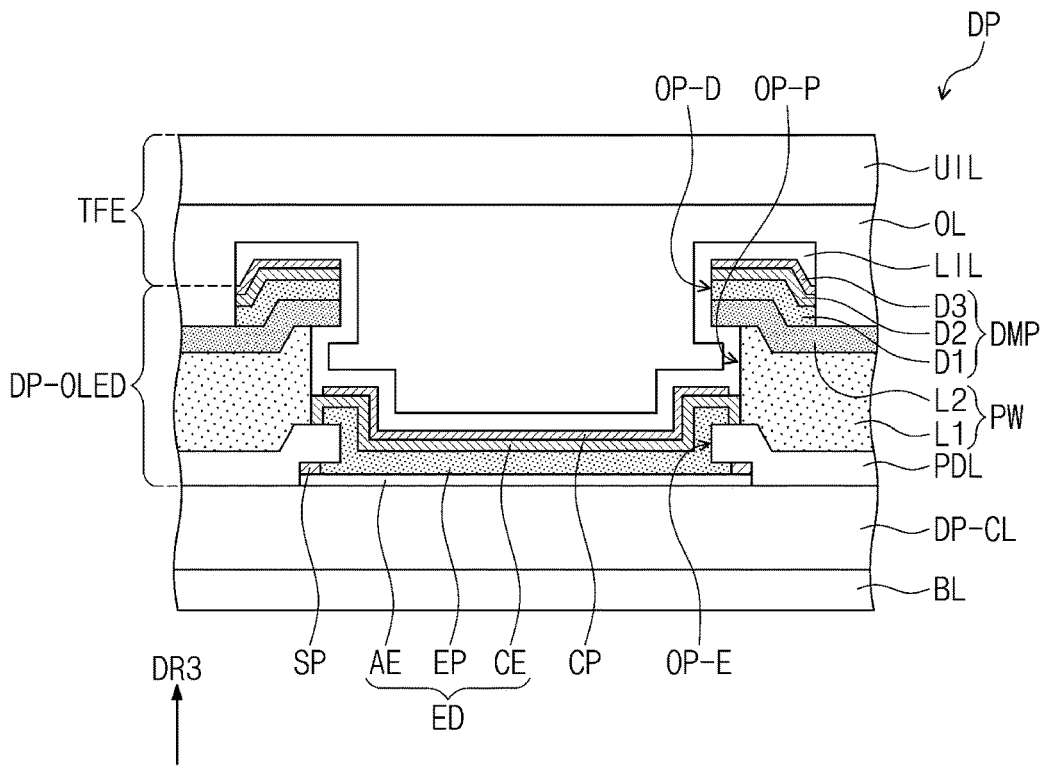

Referring to FIG. 9L, the manufacturing method of the display panel may include forming the encapsulation organic layer OL and the upper encapsulation inorganic layer UIL to complete the display panel DP after removing of the second photoresist layer PR2 (refer to FIG. 9K). The encapsulation organic layer OL may be formed by coating an organic material with an inkjet method, however, embodiments are not limited thereto or thereby. The encapsulation organic layer OL may provide a flat upper surface thereon. For example, the upper encapsulation inorganic layer UIL may be formed by depositing an inorganic material. Accordingly, the display panel DP including the base layer BL, the circuit element layer DP-CL, the display element layer DP-OLED, and the thin film encapsulation layer TFE may be formed.

Forming the bank opening and the light emitting opening, which correspond to a light emitting area providing another color, by the bank PW and the pixel definition layer PDL, forming the light emitting elements providing another color, and forming the lower encapsulation inorganic pattern layer covering the light emitting elements providing another color may be further performed between the forming of the lower encapsulation inorganic pattern layer LIL and the completing of the display panel DP. Accordingly, as shown in FIG. 6, the display panel DP including the first, second, and third light emitting elements ED1, ED2, and ED3, the first, second, and third capping pattern layers CP1, CP2, and CP3, the first-first, first-second, and first-third dummy pattern layers D1-1, D1-2, and D1-3, the second-first, second-second, and second-third dummy pattern layers D2-1, D2-2, and D2-3, the third-first, third-second, and third-third dummy pattern layers D3-1, D3-2, and D3-3, and the first, second, and third lower encapsulation inorganic pattern layers LIL1, LIL2, and LIL3 may be formed.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:
a base layer;
a pixel definition layer disposed on the base layer and including a first light emitting opening passing through the pixel definition layer;
a bank disposed on the pixel definition layer and including a first bank opening passing through the bank and overlapping the first light emitting opening; and
a first light emitting element disposed in the first bank opening, the first light emitting element including
a first anode including at least a portion exposed through the first light emitting opening,
a first cathode that is in contact with the bank, and
a first light emitting pattern layer disposed between the first anode and the first cathode,
wherein the bank includes,
a first layer comprising an AlNiLa alloy; and
a second layer disposed on the first layer, the second layer comprising a MoTa alloy oxide.

2. The display panel of claim 1, wherein the first layer comprises an $Al_xNi$ phase.

3. The display panel of claim 2, wherein the first cathode is in contact with the $Al_xNi$ phase.

4. The display panel of claim 1, wherein
the AlNiLa alloy of the first layer is an aluminum-based alloy doped with nickel (Ni) and lanthanum (La),
a content of the nickel (Ni) is equal to or greater than about 0.5 at % and equal to or smaller than about 3.0 at %, and
a content of lanthanum (La) is equal to or greater than about 0.1 at % and equal to or smaller than about 0.5 at %.

5. The display panel of claim 1, wherein the second layer has a reflectance equal to or smaller than about 30%.

6. The display panel of claim 1, wherein
the MoTa alloy oxide of the second layer is a molybdenum-based alloy oxide doped with tantalum (Ta), and
a content of the tantalum (Ta) is equal to or greater than about 1.0 at % and equal to or smaller than about 15.0 at %.

7. The display panel of claim 1, wherein
the first layer has a thickness equal to or greater than about 6,000 angstroms and equal to or smaller than about 100,000 angstroms, and
the second layer has a thickness equal to or greater than about 400 angstroms and equal to or smaller than about 800 angstroms.

8. The display panel of claim 1, further comprising:
a driving voltage line providing a bias voltage,
wherein at least a portion of the driving voltage line is covered by the first layer.

9. The display panel of claim 8, wherein the driving voltage line and the first anode have a same structure.

10. The display panel of claim 1, wherein
the first layer comprises a first inner side surface that defines a first area of the first bank opening,
the second layer comprises a second inner side surface that defines a second area of the first bank opening,
the first inner side surface of the first layer is disposed inwardly of the second inner side surface of the second layer, and
the first cathode is in contact with the first inner side surface of the first layer.

11. The display panel of claim 1, further comprising:
a second light emitting element including
a second anode,
a second cathode that is in contact with the bank, and
a second light emitting pattern layer disposed between the second anode and the second cathode, wherein
the pixel definition layer includes a second light emitting opening passing through the pixel definition layer to expose at least a portion of the second anode,
the bank includes a second bank opening passing through the bank and overlapping the second light emitting opening, and
the second light emitting element is disposed in the second bank opening.

12. The display panel of claim 1, further comprising:
a first dummy pattern layer disposed on the bank and spaced apart from the first light emitting pattern layer, the first dummy pattern layer and the first light emitting pattern layer comprising a same material;
a second dummy pattern layer disposed on the first dummy pattern layer and spaced apart from the first cathode, the second dummy pattern layer and the first cathode comprising a same material; and
a lower encapsulation inorganic pattern layer overlapping the first light emitting opening and disposed on the first light emitting element, the first dummy pattern layer, and the second dummy pattern layer.

13. A method of manufacturing a display panel, comprising:
providing a preliminary display panel comprising a base layer, an anode disposed on the base layer, and a preliminary pixel definition layer disposed on the base layer and covering the anode;
forming a first layer comprising an AlNiLa alloy on the preliminary pixel definition layer;
forming a second layer comprising a MoTa alloy oxide on the first layer;
patterning the first layer and the second layer to form a bank including a bank opening;
forming a light emitting pattern layer in the bank opening; and
forming a cathode in the bank opening to be in contact with the bank.

14. The method of claim 13, wherein the forming of the first layer is performed by a deposition process at a temperature equal to or greater than about 200 degrees Celsius and equal to or smaller than about 250 degrees Celsius.

15. The method of claim 14, wherein the forming of the second layer is performed by a deposition process at a temperature equal to or greater than about 200 degrees Celsius and equal to or smaller than about 250 degrees Celsius.

16. The method of claim 14, wherein an $Al_xNi$ phase is formed on the first layer in the forming of the first layer or the forming of the second layer.

17. The method of claim 13, wherein
the patterning of the first layer and the second layer includes,
dry etching the first layer and the second layer to form a preliminary bank opening passing through the first layer and the second layer; and
wet etching the first layer and the second layer to form the bank opening from the preliminary bank opening,
the first layer comprises a first inner side surface that defines a first area of the bank opening,

the second layer comprises a second inner side surface that defines a second area of the bank opening, and the first inner side surface is disposed inwardly of the second inner side surface in the wet etching of the first layer and the second layer.

18. The method of claim 13, further comprising:

dry etching the preliminary pixel definition layer to form a pixel definition layer including a light emitting opening overlapping the bank opening after the patterning of the first layer and the second layer and before the forming of the light emitting pattern layer.

19. The method of claim 18, further comprising:

wet etching a sacrificial pattern layer of the preliminary display panel, wherein the sacrificial pattern layer is disposed on the anode and covered by the preliminary pixel definition layer in the providing of the preliminary display panel, and the wet etching of the sacrificial pattern layer is performed to form a sacrificial opening overlapping the light emitting opening passing through the sacrificial pattern layer after the dry etching of the preliminary pixel definition layer and before the forming of the light emitting pattern layer.

20. The method of claim 13, wherein a first dummy pattern layer is spaced apart from the light emitting pattern layer, the first dummy pattern layer is disposed on the bank, and the first dummy pattern layer is formed in the forming of the light emitting pattern layer, the first dummy pattern layer and the light emitting pattern layer comprise a same material,

a second dummy pattern layer is spaced apart from the cathode, the second dummy pattern layer is disposed on the bank, and the second dummy pattern layer is formed in the forming of the cathode, and the second dummy pattern layer and the cathode comprise a same material.

21. An electronic device comprising:

a display panel; and an input sensor, the display panel comprising:

a base layer;

a pixel definition layer disposed on the base layer and including a first light emitting opening passing through the pixel definition layer;

a bank disposed on the pixel definition layer and including a first bank opening passing through the bank and overlapping the first light emitting opening; and a first light emitting element disposed in the first bank opening, the first light emitting element including a first anode including at least a portion exposed through the first light emitting opening, a first cathode that is in contact with the bank, and a first light emitting pattern layer disposed between the first anode and the first cathode, wherein the bank includes, a first layer comprising an AlNiLa alloy; and a second layer disposed on the first layer, the second layer comprising a MoTa alloy oxide.

* * * * *